(12) United States Patent
Cheng et al.

(10) Patent No.: US 7,838,913 B2
(45) Date of Patent: Nov. 23, 2010

(54) HYBRID FET INCORPORATING A FINFET AND A PLANAR FET

(75) Inventors: Kangguo Cheng, Guilderland, NY (US); Qingqing Liang, Fishkill, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 12/128,134

(22) Filed: May 28, 2008

(65) Prior Publication Data

US 2009/0294800 A1 Dec. 3, 2009

(51) Int. Cl.
*H01L 21/338* (2006.01)
(52) U.S. Cl. ........................ 257/263; 257/265; 257/329; 257/E21.676; 257/E21.693; 438/173; 438/192
(58) Field of Classification Search ................ 257/60, 257/135, 136, 263–267, 302, 328–334, E21.676, 257/E21.693; 438/137, 138, 173, 192, 167, 438/242, 212
See application file for complete search history.

(56) References Cited

U.S. PATENT DOCUMENTS

| | | | |
|---|---|---|---|
| 6,943,407 B2 * | 9/2005 | Ouyang et al. | 257/329 |
| 7,060,539 B2 | 6/2006 | Chidambarrao et al. | |
| 7,091,566 B2 * | 8/2006 | Zhu et al. | 257/401 |
| 2005/0263831 A1 | 12/2005 | Doris et al. | |
| 2007/0102756 A1 | 5/2007 | Lojek | |
| 2007/0134864 A1 | 6/2007 | Anderson et al. | |

* cited by examiner

*Primary Examiner*—Evan Pert
*Assistant Examiner*—Scott R Wilson
(74) *Attorney, Agent, or Firm*—Scully, Scott, Murphy & Presser, P.C.; Joseph P. Abate, Esq.

(57) ABSTRACT

A stack of a vertical fin and a planar semiconductor portion are formed on a buried insulator layer of a semiconductor-on-insulator substrate. A hybrid field effect transistor (FET) is formed which incorporates a finFET located on the vertical fin and a planar FET located on the planar semiconductor portion. The planar FET enables a continuous spectrum of on-current. The surfaces of the vertical fin and the planar semiconductor portion may be set to coincide with crystallographic orientations. Further, different crystallographic orientations may be selected for the surfaces of the vertical fin and the surfaces of the planar semiconductor portion to tailor the characteristics of the hybrid FET.

20 Claims, 42 Drawing Sheets

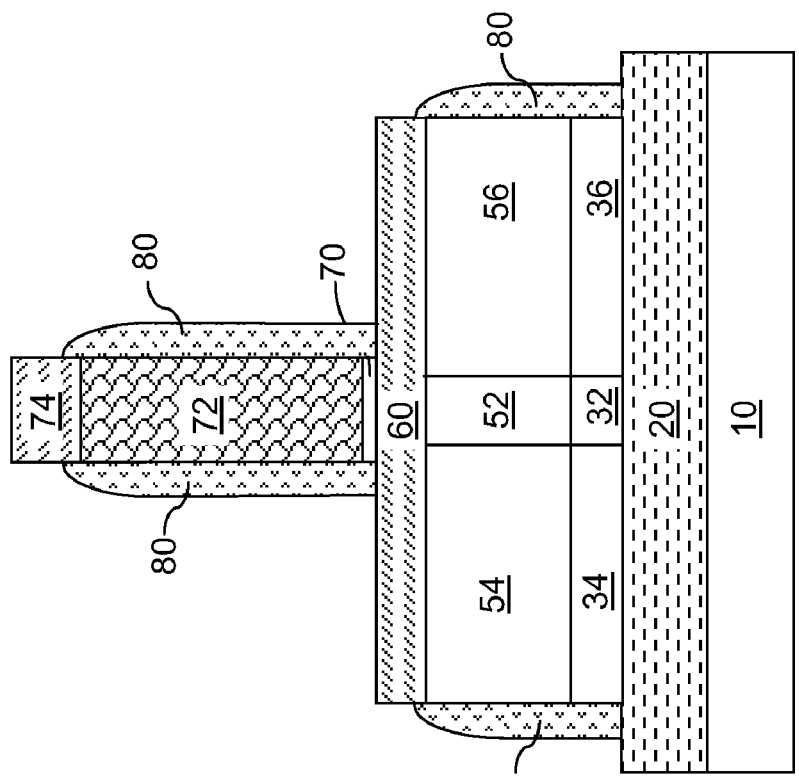
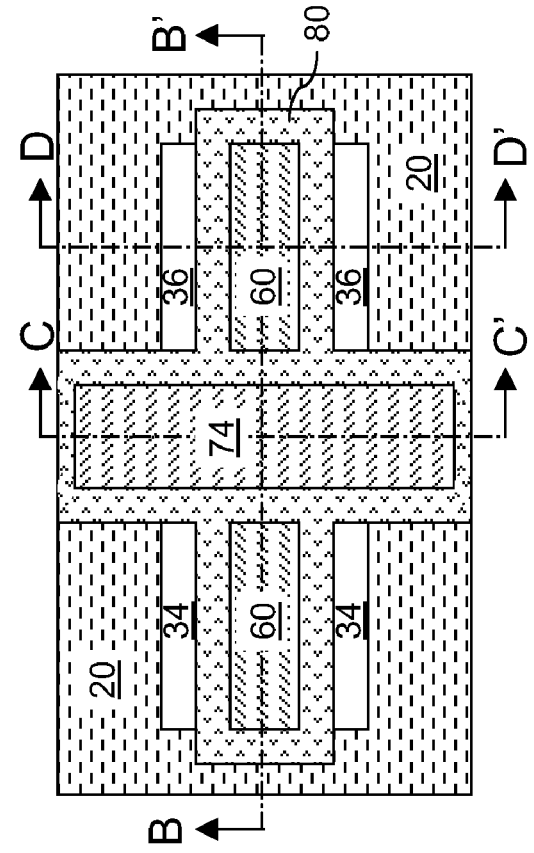
FIG. 5B
FIG. 5A

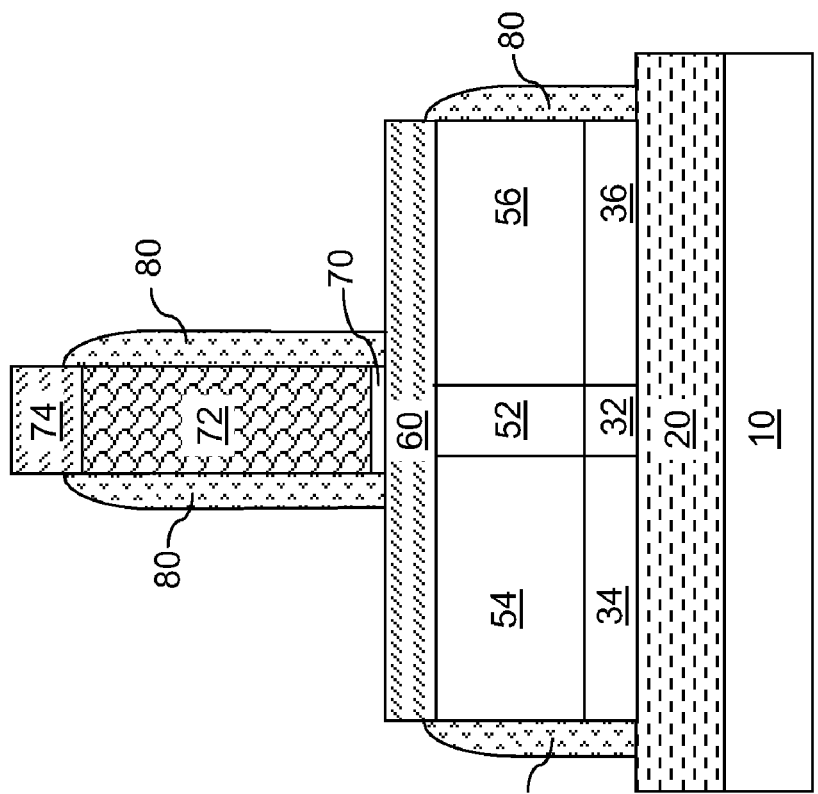
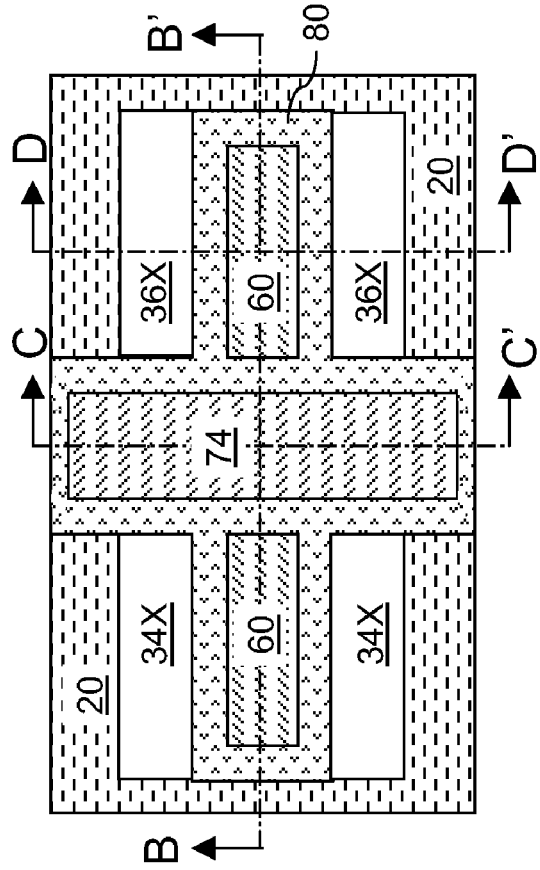
FIG. 6B
FIG. 6A

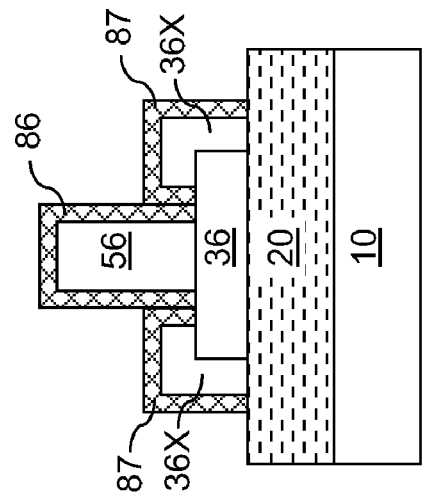
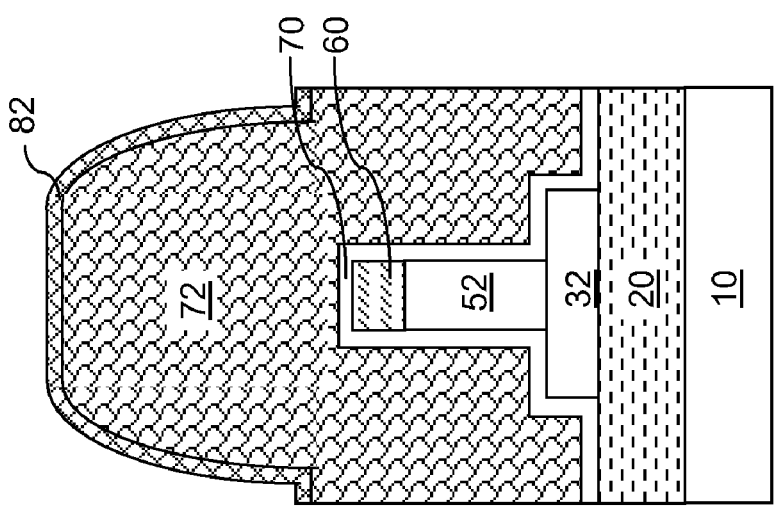
FIG. 8D
FIG. 8C

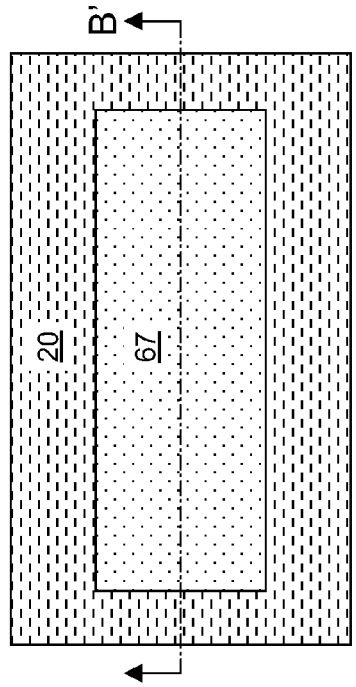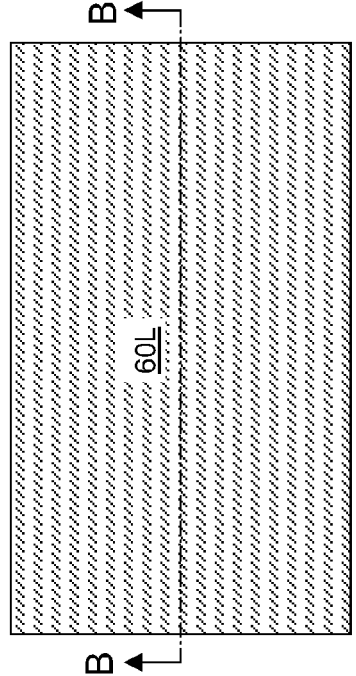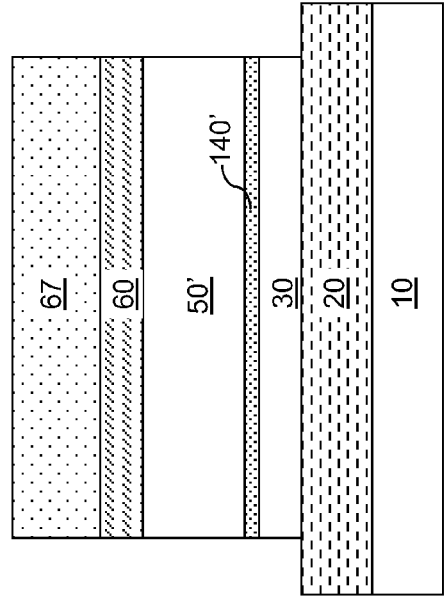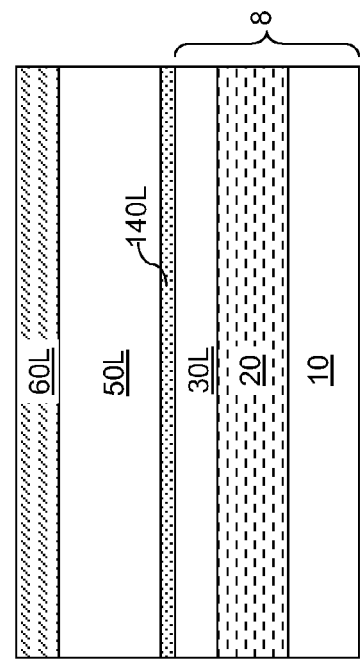

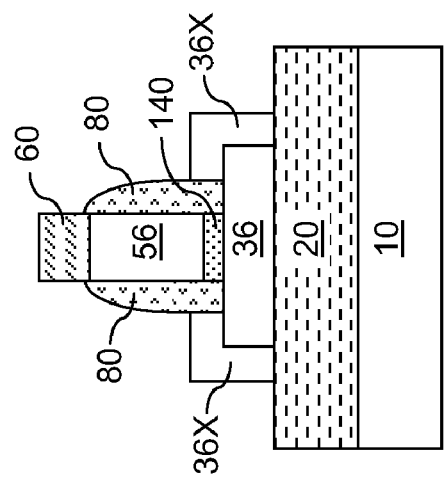
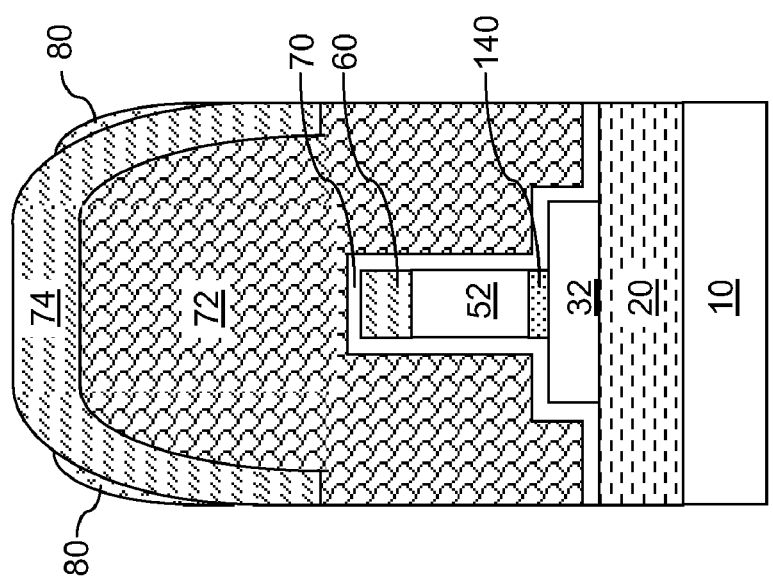
FIG. 14D
FIG. 14C

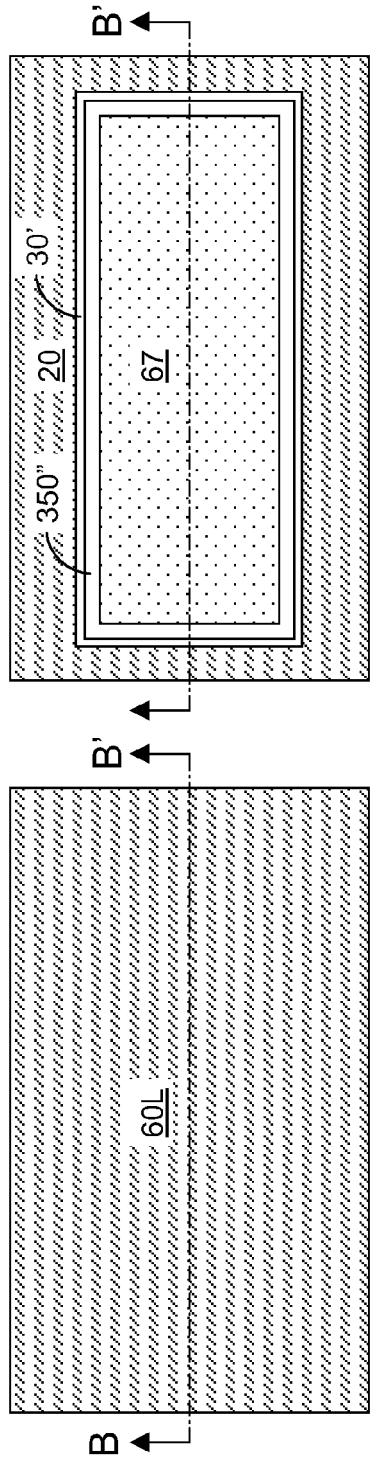
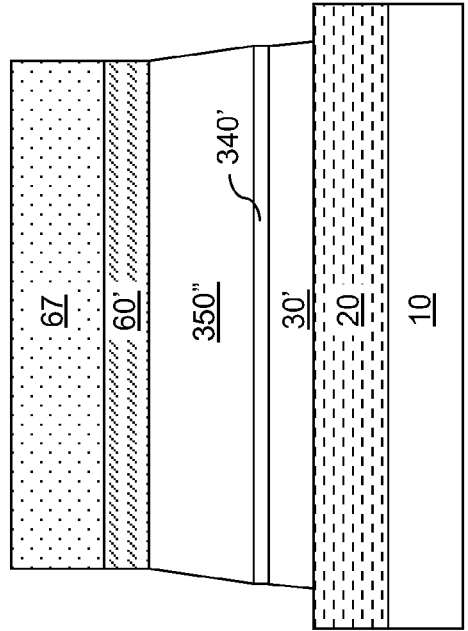
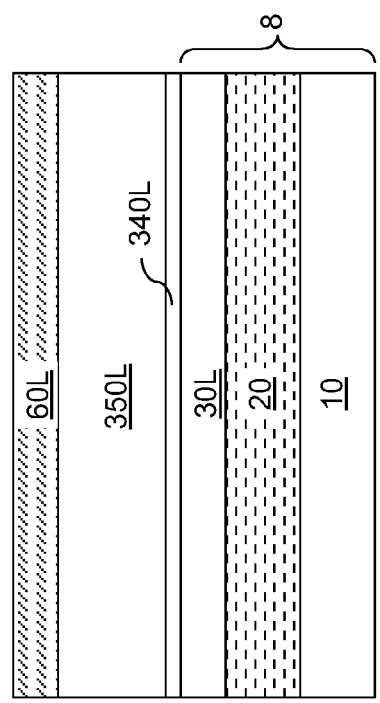
FIG. 18A
FIG. 18B
FIG. 17A
FIG. 17B

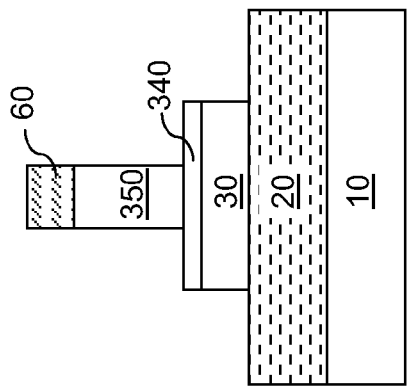
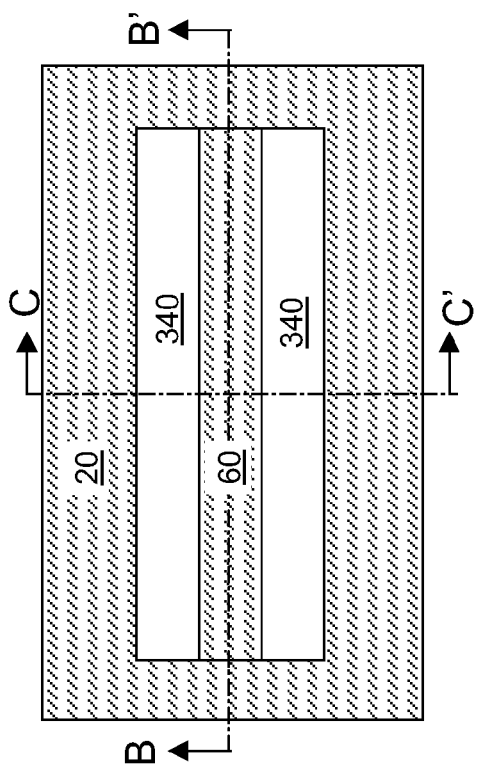
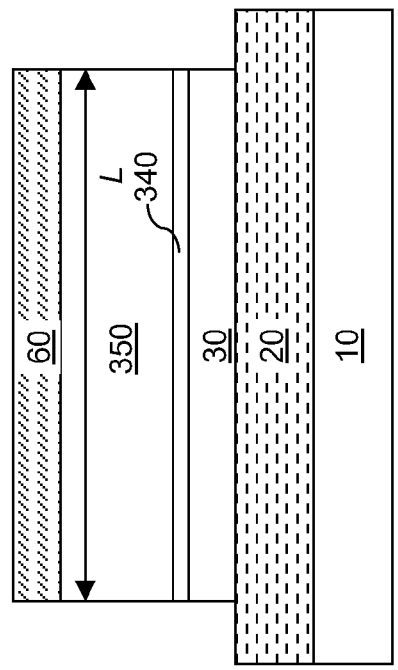
FIG. 20A
FIG. 20B
FIG. 20C

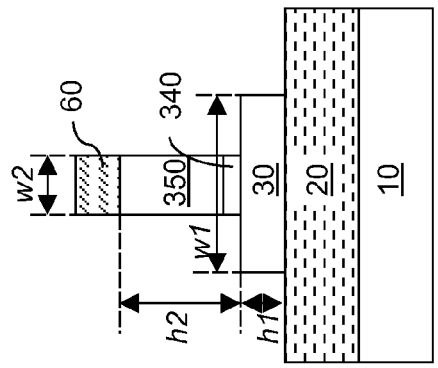
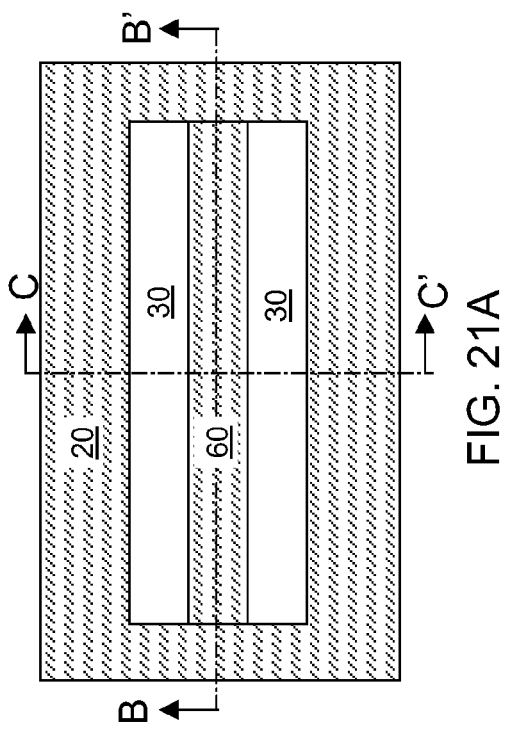
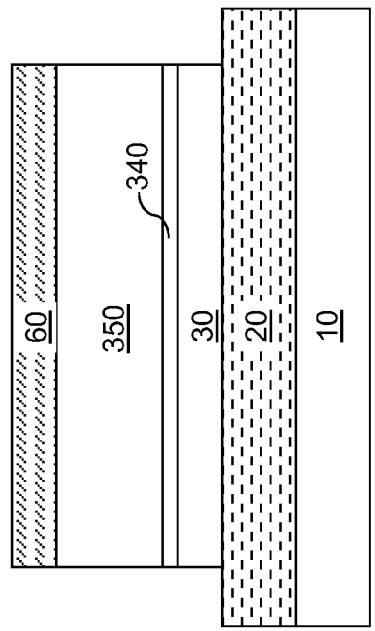
FIG. 21C
FIG. 21A
FIG. 21B

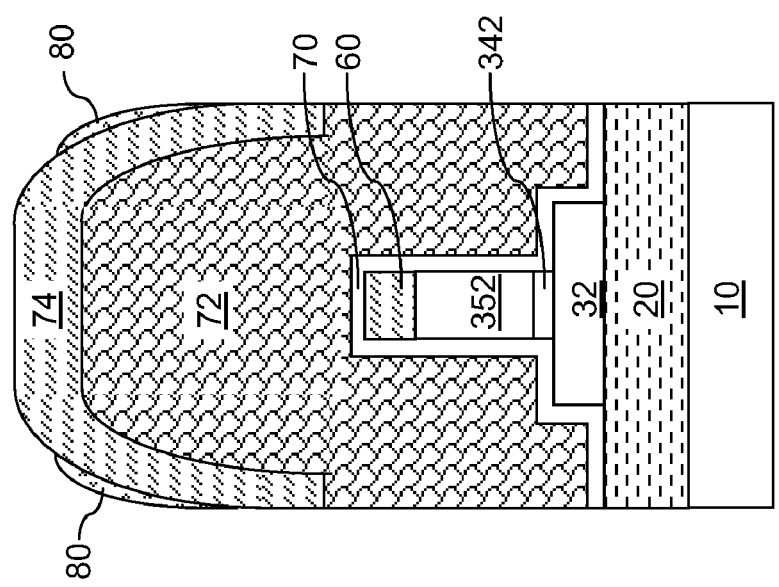
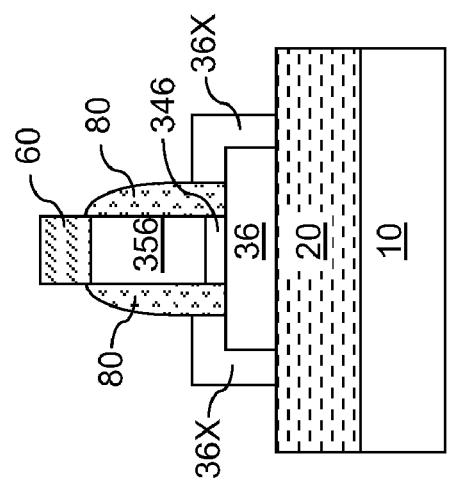
FIG. 24C
FIG. 24D

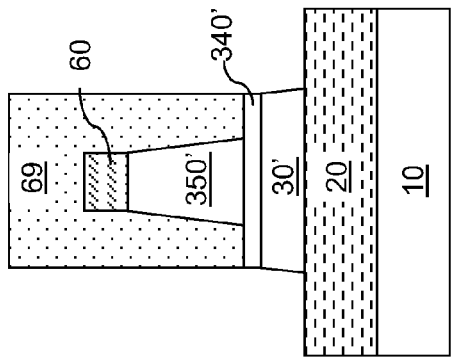
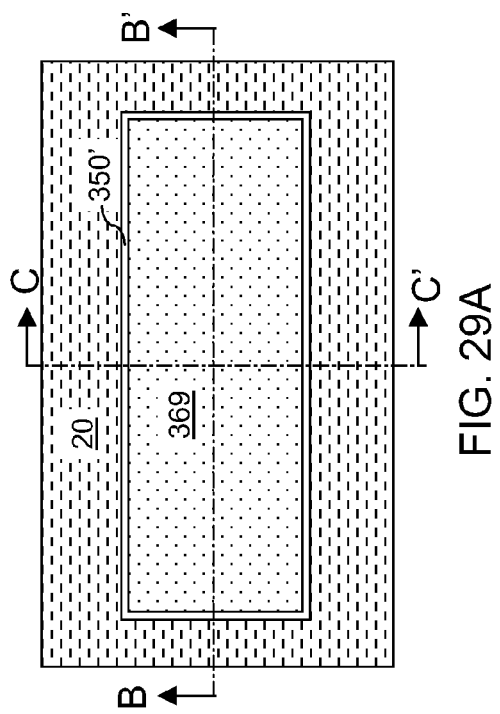
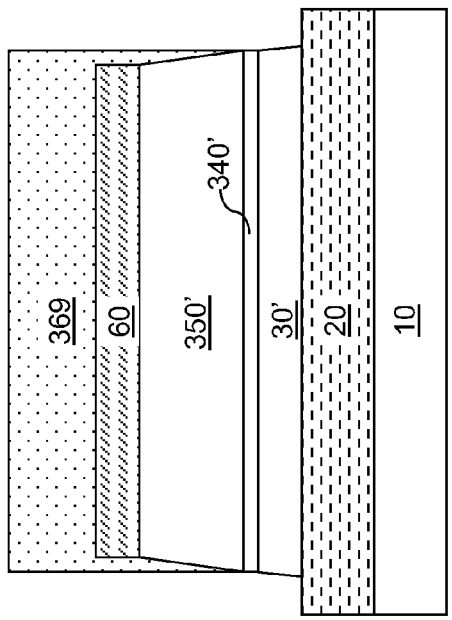

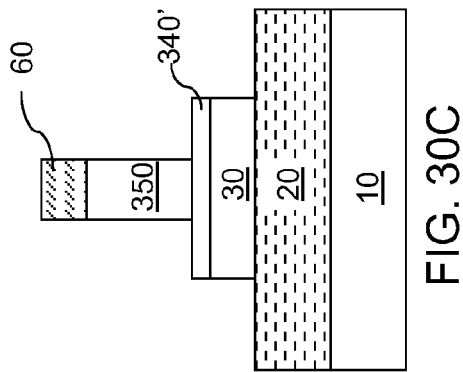
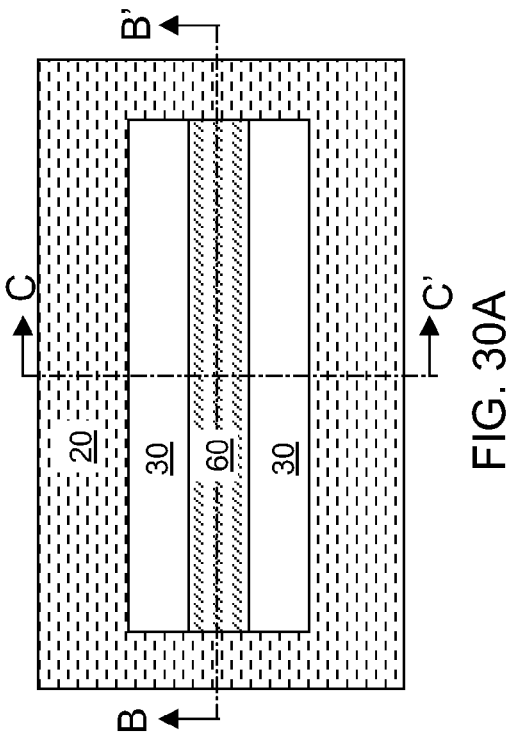
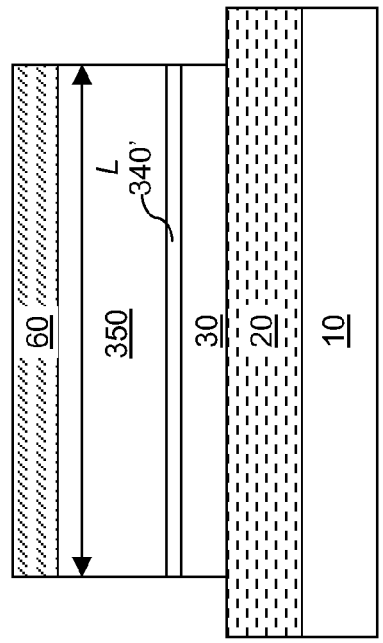

HYBRID FET INCORPORATING A FINFET AND A PLANAR FET

FIELD OF THE INVENTION

The present invention relates to semiconductor devices, and particularly, to hybrid field effect transistors incorporating a fin field effect transistor (finFET) and a planar field effect transistor (planar FET), and methods of manufacturing the same.

BACKGROUND OF THE INVENTION

Fin metal-oxide-semiconductor field effect transistor (Fin-MOSFET, or finFET) provides solutions to metal-oxide-semiconductor field effect transistor (MOSFET) scaling problems at, and below, the 45 nm node of semiconductor technology. A finFET comprises at least one narrow (preferably<30 nm wide) semiconductor fin gated on at least two opposing sides of each of the at least one semiconductor fin. Prior art finFET structures are typically formed on a semiconductor-on-insulator (SOI) substrate, because of low source/drain diffusion to substrate capacitance and ease of electrical isolation by shallow trench isolation structures.

A feature of a finFET is a gate electrode located on at least two sides of the channel of the transistor. Due to the advantageous feature of full depletion in a finFET, the increased number of sides on which the gate electrode controls the channel of the finFET enhances the controllability of the channel in a finFET compared to a planar MOSFET. The improved control of the channel allows smaller device dimensions with less short channel effects as well as larger electrical current that can be switched at high speeds. A finFET device has faster switching times, equivalent or higher current density, and much improved short channel control than the mainstream CMOS technology utilizing similar critical dimensions.

In a typical finFET structure, at least one horizontal channel on a vertical sidewall is provided within the semiconductor "fin" that is set sideways, or edgewise, upon a substrate. Typically, the fin comprises a single crystalline semiconductor material with a substantially rectangular cross-sectional area. Also typically, the height of the fin is greater than width of the fin to enable higher on-current per unit area of semiconductor area used for the finFET structure. In order to obtain desirable control of short channel effects (SCEs), the semiconductor fin is thin enough in a device channel region to ensure forming fully depleted semiconductor devices. Typically, the thickness, or the horizontal width, of a fin in a finFET is less than two-thirds of its gate length in order to obtain good control of the short channel effect.

While providing improved MOSFET performance, the finFETs, however, pose unique design challenges. While planar MOSFET devices have virtually no limit on the width of the device above the lithographical minimum dimension and therefore, the size of planar MOSFETs may be adjusted arbitrarily, typical finFETs have identical vertical dimensions for the fins, thereby limiting the size of the finFET to integer multiples of a minimum size finFET for a given channel length. In other words, for the control of the on-current and the off-current of transistors, planar MOSFETs provide two parameters, which are the width, W and the length, L of the channel but finFETs provide only one parameter, which is the length, L of the finFET since the height of the fin, and consequently the width of the channel is fixed for all finFETs. Therefore, for a given transistor length, L, which defines the ratio of the on-current to off-current, the amount of on-current from an individual fin is fixed. Using multiple fins for a finFET provide integer multiples for the total current but non-integer fractions or non-integer multiples of the on-current of an individual fin requires non-obvious or elaborate processing schemes and/or structures. Further, transistors with different on-currents are often required in the design of high performance integrated circuits.

Further, prior art finFETs typically suffer from deviations of surfaces of the fins from an intended crystallographic orientation which may be caused by a taper in the sidewalls of the fins during an anisotropic etch. Such deviations in the crystallographic orientation of the surfaces of the fins cause increase in leakage current, thereby degrading device performance.

In addition, prior art finFETs allow formation of field effect transistors on surfaces of a single crystalline substrate, which result in limited choice of crystallographic orientations.

In view of the above, there exists a need to provide a field effect transistor providing the benefits of a finFET, while allowing continuous variation of on-current.

Further, there exists a need to provide a field effect transistor in which surface orientations of surfaces of fins are aligned to crystallographic orientations so that leakage current of the field effect transistor may be reduced.

Yet further, there exists a need to provide semiconductor structure offering expanded choices for crystallographic orientations for channels of field effect transistors.

SUMMARY OF THE INVENTION

The present invention addresses the needs described above by providing hybrid field effect transistors incorporating a finFET and a planar field effect transistor (FET) formed on a semiconductor-on-insulator (SOI) substrate.

According to the present invention, a stack of a vertical fin and a planar semiconductor portion are formed on a buried insulator layer of a semiconductor-on-insulator substrate. A hybrid field effect transistor (FET) is formed which incorporates a finFET located on the vertical fin and a planar FET located on the planar semiconductor portion. The planar FET enables a continuous spectrum of on-current. The surfaces of the vertical fin and the planar semiconductor portion may be set to coincide with crystallographic orientations. Further, different crystallographic orientations may be selected for the surfaces of the vertical fin and the surfaces of the planar semiconductor portion to tailor the characteristics of the hybrid FET.

According to an aspect of the present invention, a semiconductor structure is provided, which comprises:

a planar semiconductor portion having a first width and a first height and located above and abutting an insulator layer;

a semiconductor fin having a second width and located above and abutting an upper surface of the planar semiconductor portion, wherein the planar semiconductor portion and a portion of the semiconductor fin comprise different semiconductor materials, and wherein the first width is greater than the second width;

a gate dielectric abutting sidewalls of the vertical fin and horizontal upper surface of the planar semiconductor portion; and a gate electrode abutting the gate dielectric and overlying the planar semiconductor portion and the vertical fin.

According to another aspect of the present invention, another semiconductor structure is provided, which comprises:

a planar semiconductor portion having a first width and located above and abutting an insulator layer;

a dielectric material portion having a second width and located above and abutting the planar semiconductor portion, wherein the first width is greater than the second width;

a semiconductor fin having the second width and located above and abutting the dielectric material portion;

a gate dielectric abutting sidewalls of the vertical fin and horizontal upper surface of the planar semiconductor portion; and a gate electrode abutting the gate dielectric and overlying the planar semiconductor portion and the vertical fin.

According to yet another aspect of the present invention, a method of forming a semiconductor structure is provided, which comprises:

forming an upper semiconductor layer directly on a semiconductor-on-insulator (SOI) layer of a semiconductor-on-insulator (SOI) substrate, wherein the upper semiconductor layer and the SOI layer comprise different semiconductor materials;

patterning the SOI layer, wherein a remaining portion of the SOI layer constitutes a planar semiconductor portion having a first width;

patterning the upper semiconductor layer, wherein a remaining portion of the upper semiconductor layer constitutes a semiconductor fin having a second width, wherein the first width is greater than the second width;

forming a gate dielectric on sidewalls of the semiconductor fin and on horizontal surfaces of the planar semiconductor portion; and forming a gate electrode abutting the gate dielectric and overlying the planar semiconductor portion and the vertical fin.

According to still another aspect of the present invention, another method of forming a semiconductor structure is provided, which comprises:

forming a stack of an etch stop layer and an upper semiconductor layer directly on a semiconductor-on-insulator (SOI) layer of a semiconductor-on-insulator (SOI) substrate, wherein the etch stop layer and the upper semiconductor layer comprise different materials;

patterning the SOI layer, wherein a remaining portion of the SOI layer constitutes a planar semiconductor portion having a first width;

patterning the upper semiconductor layer selective to the SOI layer, wherein a remaining portion of the upper semiconductor layer constitutes a semiconductor fin having a second width, wherein the first width is greater than the second width;

forming a gate dielectric on sidewalls of the semiconductor fin and on horizontal surfaces of the planar semiconductor portion; and forming a gate electrode abutting the gate dielectric and overlying the planar semiconductor portion and the vertical fin.

BRIEF DESCRIPTION OF THE DRAWINGS

FIGS. 1A, 1B, 2A, 2B, 3A-3C, 4A-4D, 5A-5D, 6A-6D, 7A-7D, and 8A-8D are various sequential views of a first exemplary semiconductor structure according to a first embodiment of the present invention. Figures with the same numeric label correspond to the same stage of manufacturing. Figures with the suffix "A" are top-down views. Figures with the suffix "B," "C," or "D" are vertical cross-sectional views along the plane B-B', C-C', or D-D', respectively, of the corresponding figure with the same numeric label and the suffix "A."

FIGS. 1A and 1B correspond to a step after formation of an upper semiconductor layer 50L and a hardmask layer 60L on a semiconductor-on-insulator (SOI) substrate 8. FIGS. 2A and 2B correspond to a step after patterning of a planar semiconductor portion 30. FIGS. 3A-3C correspond to a step after formation of a semiconductor fin 50. FIGS. 4A-4D correspond to a step after formation of a gate electrode 72 and a gate cap portion 74. FIGS. 5A-5D correspond to a step after formation of source regions, drain regions, and a dielectric spacer 80. FIGS. 6A-6D correspond to a step after formation of a pair of epitaxial raised source portions 34X and a pair of epitaxial raised drain portions 36X. FIGS. 7A-7D correspond to a step after recessing of the gate cap portion 74 and a hard mask portion 60. FIGS. 8A-8D correspond to a step after formation of various metal semiconductor alloy regions.

FIGS. 9A, 9B, 10A, 10B, 11A-11C, 12A-12D, 13A-13D, 14A-14D, 15A-15D, and 16A-16D are various sequential views of a second exemplary semiconductor structure according to a second embodiment of the present invention. Figures with the same numeric label correspond to the same stage of manufacturing. Figures with the suffix "A" are top-down views. Figures with the suffix "B" "C," or "D" are vertical cross-sectional views along the plane B-B', C-C', or D-D', respectively, of the corresponding figure with the same numeric label and the suffix "A."

FIGS. 9A and 9B correspond to a step after formation of an etch stop dielectric layer 140L, an upper semiconductor layer 50L, and a hardmask layer 60L on an SOI substrate 8. FIGS. 10A and 10B correspond to a step after patterning of a planar semiconductor portion 30. FIGS. 11A-11C correspond to a step after formation of a semiconductor fin 50. FIGS. 12A-12D correspond to a step after formation of a gate electrode 72 and a gate cap portion 74. FIGS. 13A-13D correspond to a step after formation of source regions, drain regions, and a dielectric spacer 80. FIGS. 14A-14D correspond to a step after formation of a pair of epitaxial raised source portions 34X and a pair of epitaxial raised drain portions 36X. FIGS. 15A-15D correspond to a step after recessing of the gate cap portion 74 and a hard mask portion 60. FIGS. 16A-16D correspond to a step after formation of various metal semiconductor alloy regions.

FIGS. 17A, 17B, 18A, 18B, 19A-19C, 20A-20C, 21A-21C, 22A-22D, 23A-23D, 24A-24D, 25A-25D, and 26A-26D are various sequential views of a third exemplary semiconductor structure according to a third embodiment of the present invention. Figures with the same numeric label correspond to the same stage of manufacturing. Figures with the suffix "A" are top-down views. Figures with the suffix "B," "C," or "D" are vertical cross-sectional views along the plane B-B', C-C', or D-D', respectively, of the corresponding figure with the same numeric label and the suffix "A."

FIGS. 17A and 17B correspond to a step after formation of an etch stop semiconductor layer 340L, an upper semiconductor layer 350L, and a hardmask layer 60L on an SOI substrate 8. FIGS. 18A and 18B correspond to a step after patterning of a tapered planar semiconductor portion 30'. FIGS. 19A-19C correspond to a step after formation of a prototype semiconductor fin upper portion 350'. FIGS. 20A-20C correspond to a step after formation of a planar semiconductor portion 30 and a semiconductor fin upper portion 350. FIGS. 21A-21C correspond to a step after formation of a semiconductor fin lower portion 340. FIGS. 22A-22D correspond to a step after formation of a gate electrode 72 and a gate cap portion 74. FIGS. 23A-23D correspond to a step after formation of source regions, drain regions, and a dielectric spacer 80. FIGS. 24A-24D correspond to a step after formation of a pair of epitaxial raised source portions 34X and a pair of epitaxial raised drain portions 36X. FIGS. 25A-25D correspond to a step after recessing of the gate cap portion 74 and a hard mask portion 60. FIGS. 26A-26D correspond to a step after formation of various metal semiconductor alloy regions.

FIGS. 27A, 27B, 28A, 28B, 29A-29C, 30A-30C, and 31A-31C are various sequential views of a fourth exemplary semiconductor structure according to a fourth embodiment of the present invention. Figures with the same numeric label correspond to the same stage of manufacturing. Figures with the suffix "A" are top-down views. Figures with the suffix "B" or "C" are vertical cross-sectional views along the plane B-B' or C-C', respectively, of the corresponding figure with the same numeric label and the suffix "A."

FIGS. 27A and 27B correspond to a step after formation of an etch stop semiconductor layer 340L, an upper semiconductor layer 350L, and a hardmask layer 60L on an SOI substrate 8. FIGS. 28A and 28B correspond to a step after patterning of a prototype semiconductor fin upper portion 350'. FIGS. 29A-29C correspond to a step after formation of a tapered planar semiconductor portion 30'. FIGS. 30A-30C correspond to a step after formation of a planar semiconductor portion 30 and a semiconductor fin upper portion 350. FIGS. 31A-31C correspond to a step after formation of a semiconductor fin lower portion 340.

DETAILED DESCRIPTION OF THE INVENTION

Figure 2A:
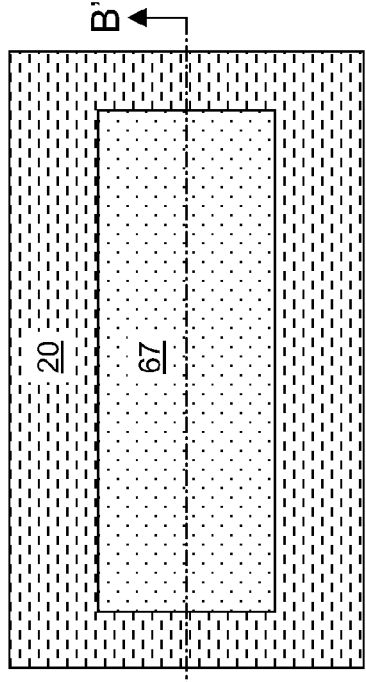

As stated above, the present invention relates to hybrid field effect transistors incorporating a fin field effect transistor (finFET) and a planar field effect transistor (planar FET), and methods of manufacturing the same, which are now described in detail with accompanying figures. It is noted that like and corresponding elements are referred to by like reference numerals.

Figure 1A:
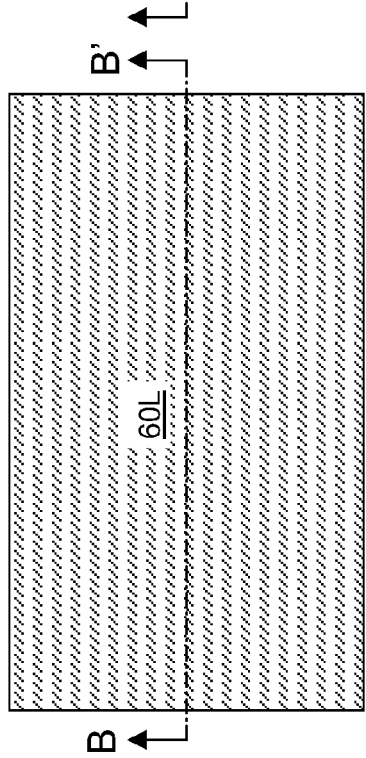
Figure 1B:
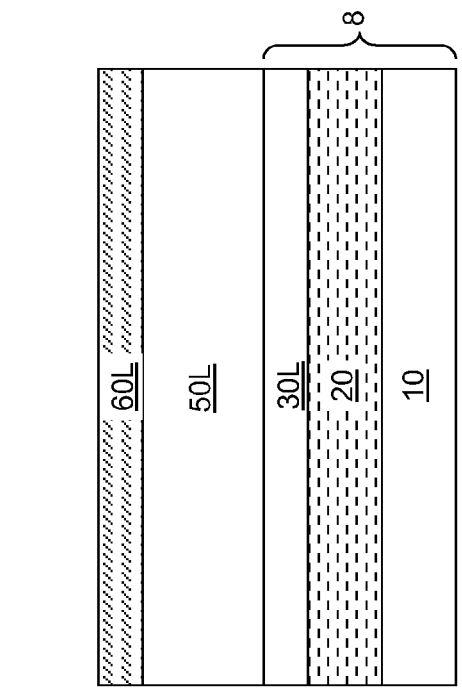

Referring to FIGS. 1A and 1B, a first exemplary semiconductor structure according to a first embodiment of the present invention comprises a semiconductor-on-insulator (SOI) substrate 8 containing a handle substrate 10, a buried insulator layer 20, and a semiconductor-on-insulator (SOI) layer 30L. The handle substrate 10 may comprise a semiconductor material, an insulator material, or a metallic material. Typically, the handle substrate 10 comprises a semiconductor material, which may be single crystalline, polycrystalline, or amorphous.

The SOI layer 30L comprises a semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In an exemplary case, the semiconductor material comprises silicon. Preferably, the SOI layer 30L is single crystalline.

The SOI layer 30L may be doped with electrical dopants of a first conductivity type. The electrical dopants may be at least one of p-type dopants such as B, Ga, and In. Alternately, the electrical dopants may be at least one of n-type dopants such as P, As, and Sb. The type of doping of the SOI layer 30L is herein referred to as a first conductivity type doping, which may be a p-type doping or an n-type doping. The concentration of the electrical dopants may be from about $1.0 \times 10^{15}$ atoms/cm$^3$ to about $1.0 \times 10^{19}$ atoms/cm$^3$. Non-electrical stress-generating dopants such as Ge and/or C may also be present. The SOI layer 30L has a thickness from about 20 nm to about 300 nm, and typically from about 40 nm to about 150 nm, although greater and lesser thicknesses are also contemplated herein.

While the present invention is described with an SOI layer 30L located in an SOI substrate 8, the present invention may be implemented on a semiconductor-on-insulator (SOI) portion of a hybrid substrate containing a bulk portion and the SOI portion.

An upper semiconductor layer 50L is formed on the SOI layer 30L. The upper semiconductor layer 50L has a different composition than the SOI layer 30L. In one case, the upper semiconductor layer 50L and the SOI layer 30L comprise the same semiconductor material having different dopant contents, either in doping concentration or in dopant species. For example, the upper semiconductor layer 50L and the SOI layer 30L comprise silicon, but the upper semiconductor layer 50L consists of undoped silicon and the SOI layer 30L consists of doped silicon, or vice versa. In another case, the upper semiconductor layer 50L and the SOI layer 30L comprise different semiconductor materials. Each of the upper semiconductor layer 50L and the SOI layer 30L may be doped or undoped in this case.

The upper semiconductor layer 50L may be formed by bonding of a semiconductor layer on another handle substrate (not shown) to the SOI substrate 8. Preferably, the upper semiconductor layer 50L comprises a single crystalline material. In this case, the upper semiconductor layer 50L may have the same crystallographic orientations and surface orientation as, or different crystallographic orientations and surface orientation than, the SOI layer 30L.

Alternately, the upper semiconductor layer 50L may be formed by epitaxial growth of a semiconductor material on the SOI layer 10. In this case, the upper semiconductor layer 50L has the same crystallographic orientations and surface orientation as the SOI layer 30.

For the purposes of description of the present invention, a semiconductor material has a different composition than another semiconductor material if the elemental composition of the semiconductor materials are different, if the species of the electrical dopants, e.g., B, Ga, In, P, As, and Sb, within the semiconductor materials are different, or if the concentrations of the electrical dopants, e.g., B, Ga, In, P, As, and Sb, within the semiconductor materials are different. A semiconductor layer comprises a different semiconductor material than another semiconductor layer if the composition of the semiconductor materials within the semiconductor layers are different, in which the non-semiconductor materials such as dopants are excluded from the composition of the semiconductor materials. In the case of compound semiconductor materials, non-stoichiometric dopants are excluded from the composition of the semiconductor material. For example, the semiconductor material of a gallium doped gallium arsenide is gallium arsenide since the additional gallium atoms constitute dopants and not a semiconductor material by itself.

The upper semiconductor layer 50L may comprise any of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials, provided that the composition of the upper semiconductor layer 50L is different from the composition of the SOI layer 30L either by differences in doping or by the composition of semiconductor materials. The differences in the composition between the upper semiconductor layer 50L and the SOI layer 30L is necessary to enable a selective etching of the upper semiconductor layer 50L relative to the SOI layer 30L to enable formation of a semiconductor fin, which is described below.

Preferably, the upper semiconductor layer 50L has a doping of the first conductivity type, i.e., a doping of the same conductivity type as the planar semiconductor layer 30. For example, the concentration of the electrical dopants may be from about $1.0 \times 10^{15}$ atoms/cm$^3$ to about $1.0 \times 10^{19}$ atoms/cm$^3$.

A hardmask layer 60L is formed on the SOI layer 30L. The hardmask layer 60L may comprise a single dielectric layer or a stack of multiple dielectric layers. For example, the hardmask layer 60L may comprise a single silicon nitride layer having a thickness from about 20 nm to about 200 nm, and preferably from about 40 nm to about 100 nm. Alternately, the hardmask layer 60L may comprise a stack of a first hardmask layer (not shown separately) comprising silicon nitride and formed directly on the upper semiconductor layer 50L and a second hardmask layer (not shown separately) formed on the first hardmask layer. The first hardmask layer may comprise silicon nitride and the second hardmask layer may comprise silicon oxide.

Figure 2B:
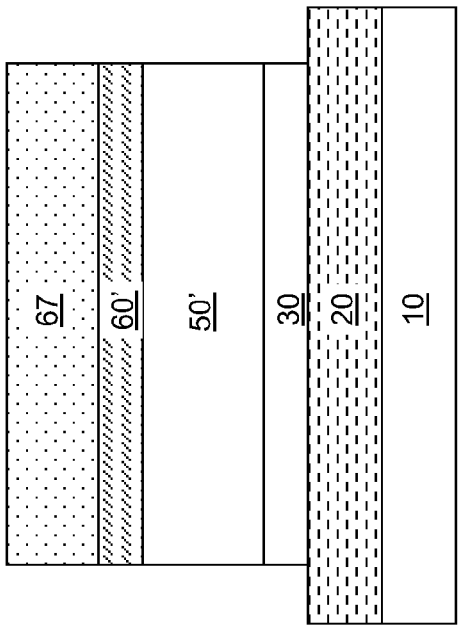

Referring to FIGS. 2A and 2B, a first photoresist 67 is applied over the hardmask layer 60L and lithographically patterned in the shape of a planar semiconductor portion to be subsequently formed. The shape of the planar semiconductor portion may be substantially rectangular. The pattern in the first photoresist 67 is transferred into the stack of the hardmask layer 60L, the upper semiconductor layer 50L, and the SOI layer 30L by an anisotropic etch, which may be a reactive ion etch. The remaining portion of the hardmask layer 60L comprises an intermediate hardmask portion 60'. The remaining portion of the upper semiconductor layer 50L comprises an intermediate upper semiconductor portion 50'. The remaining portion of the SOI layer 30 comprises a planar semiconductor portion 30. The anisotropic etch is preferably selective to the buried insulator layer 20. The sidewalls of the intermediate hardmask portion 60', the intermediate upper semiconductor portion 50', and the planar semiconductor portion 30 are substantially vertically coincident. The first photoresist 67 is subsequently removed.

Figure 3C:
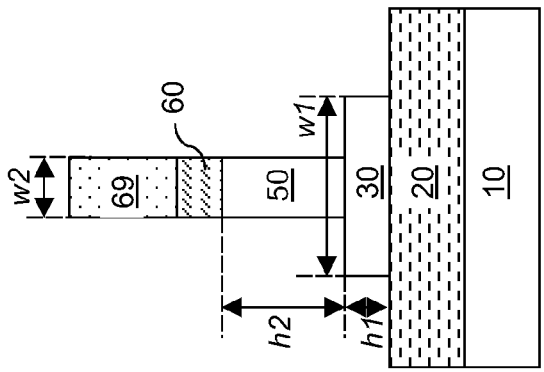
Figure 3A:
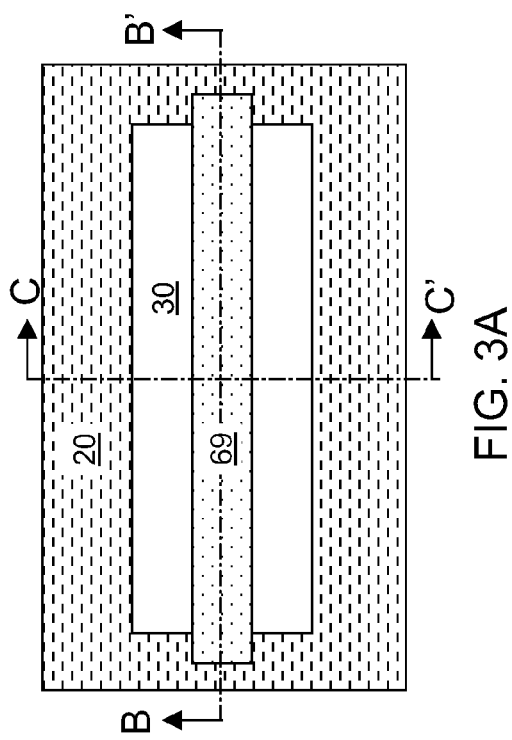
Figure 3B:
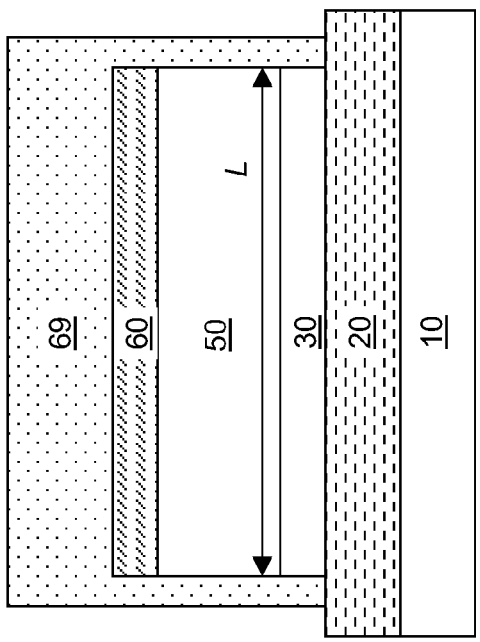
Figure 4B:
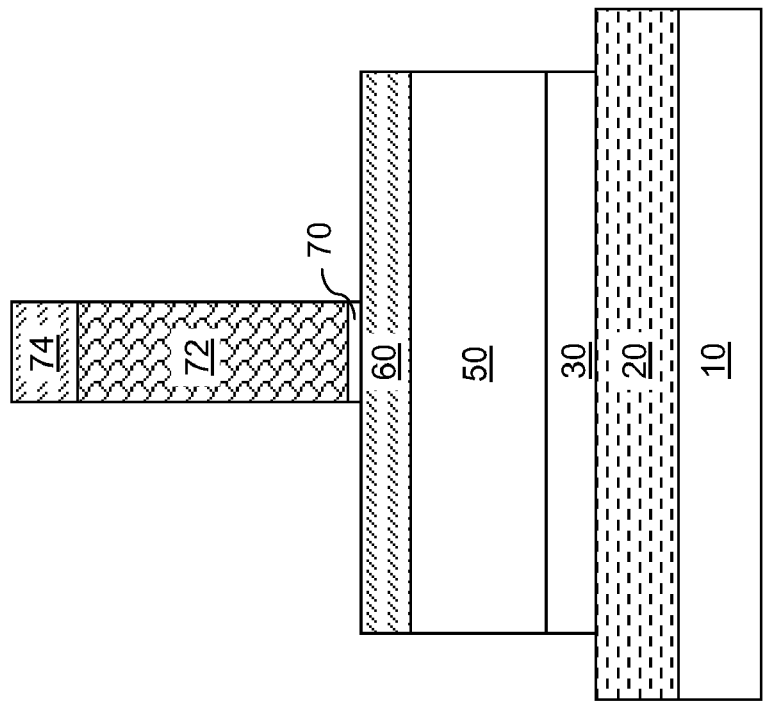
Figure 4A:
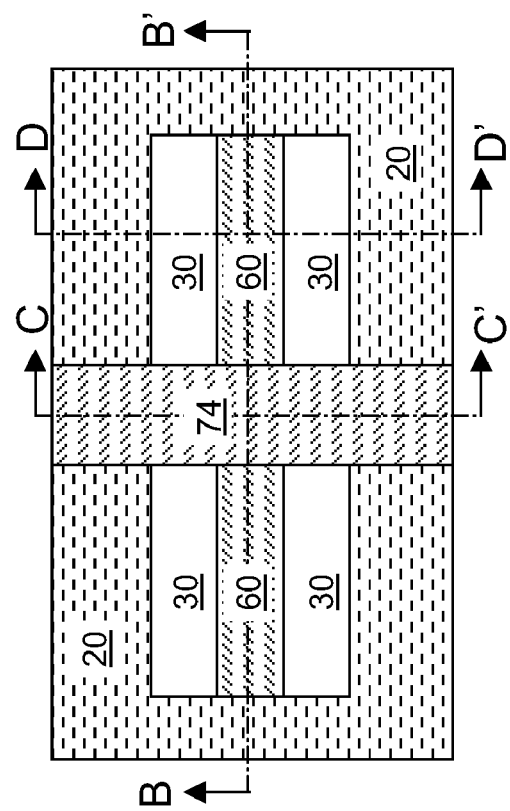
Figure 4D:
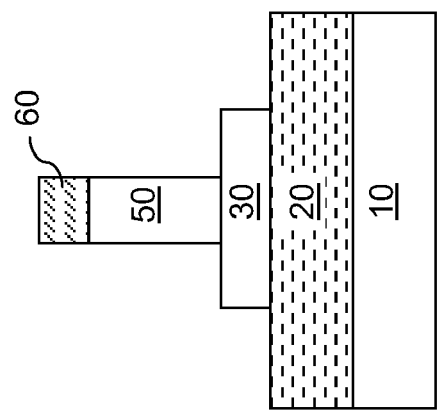
Figure 4C:
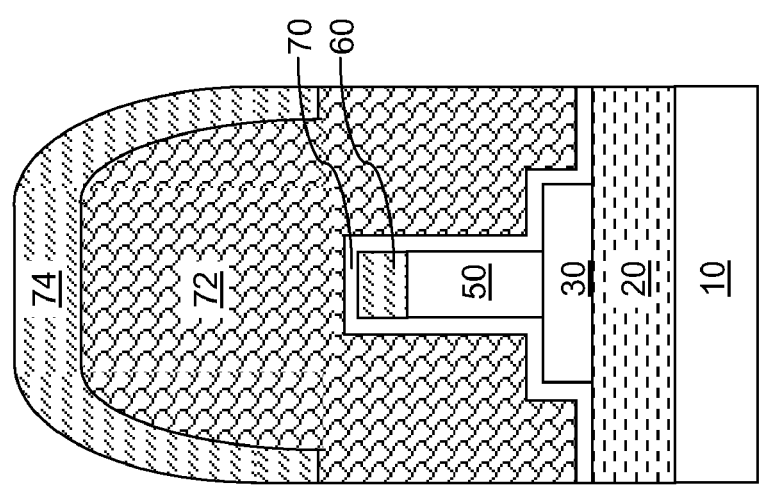
Figure 5C:
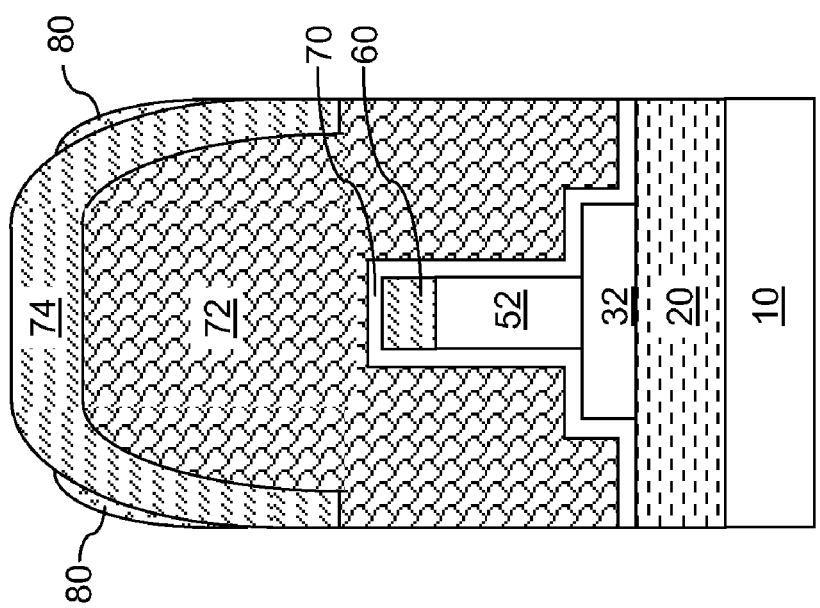
Figure 5D:
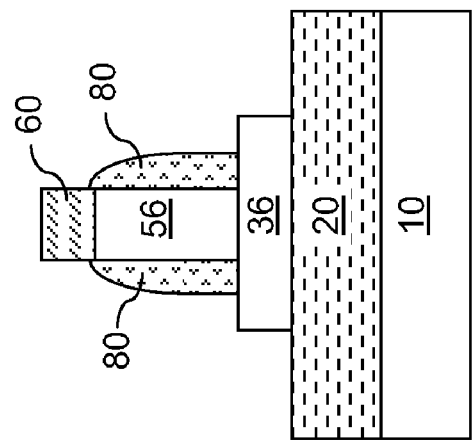
Figure 6D:
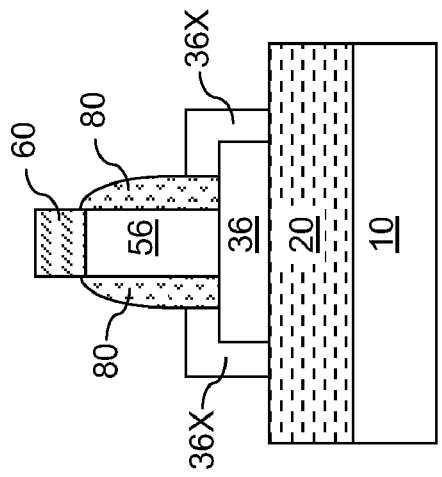
Figure 6C:
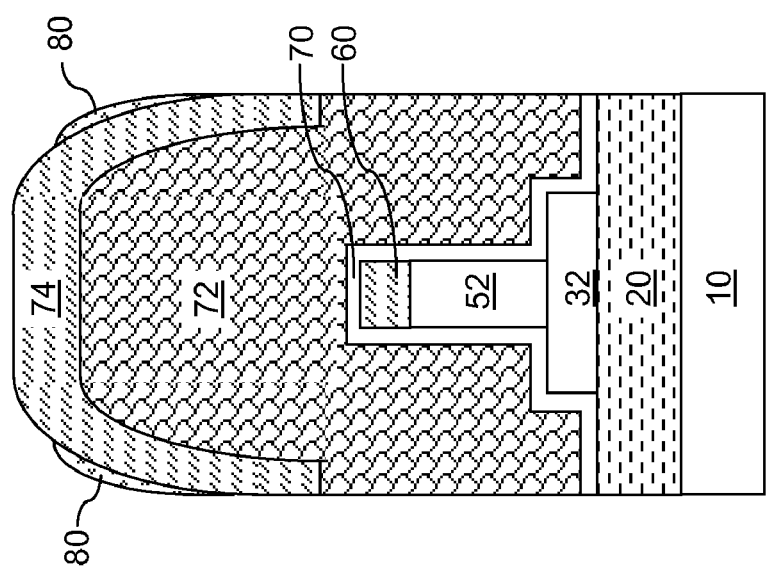
Figure 7B:
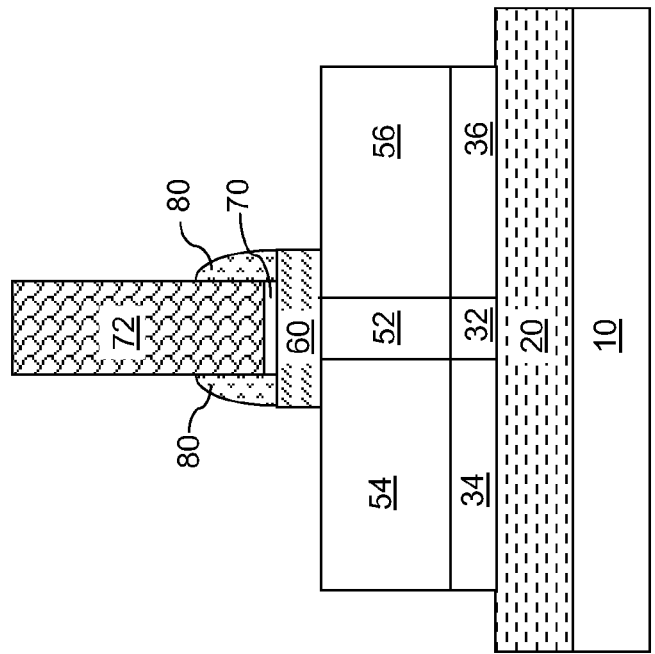
Figure 7A:
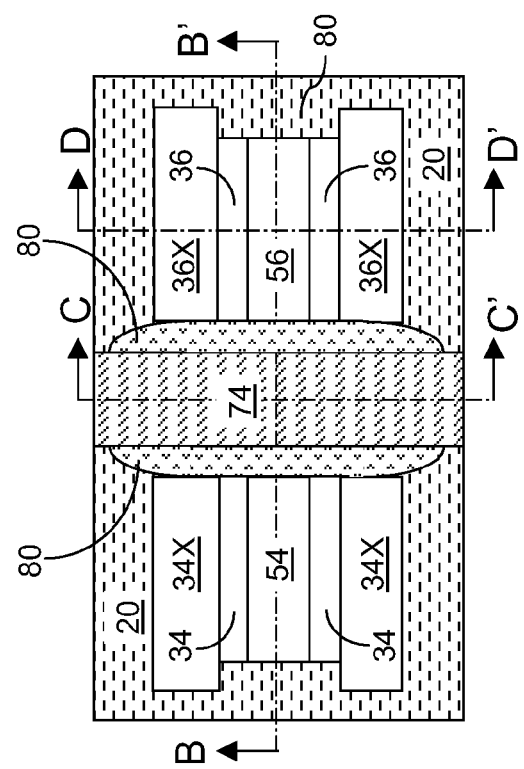
Figure 7D:
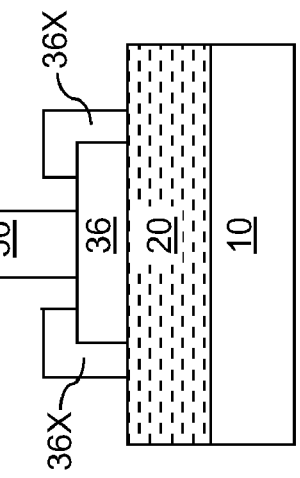
Figure 7C:
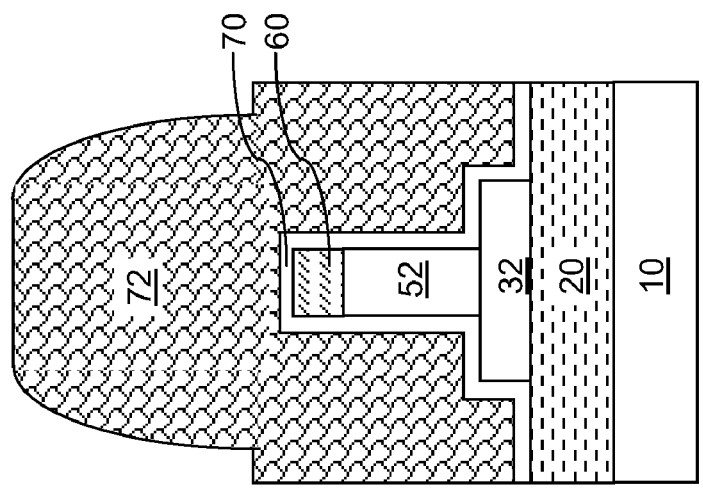
Figure 8B:
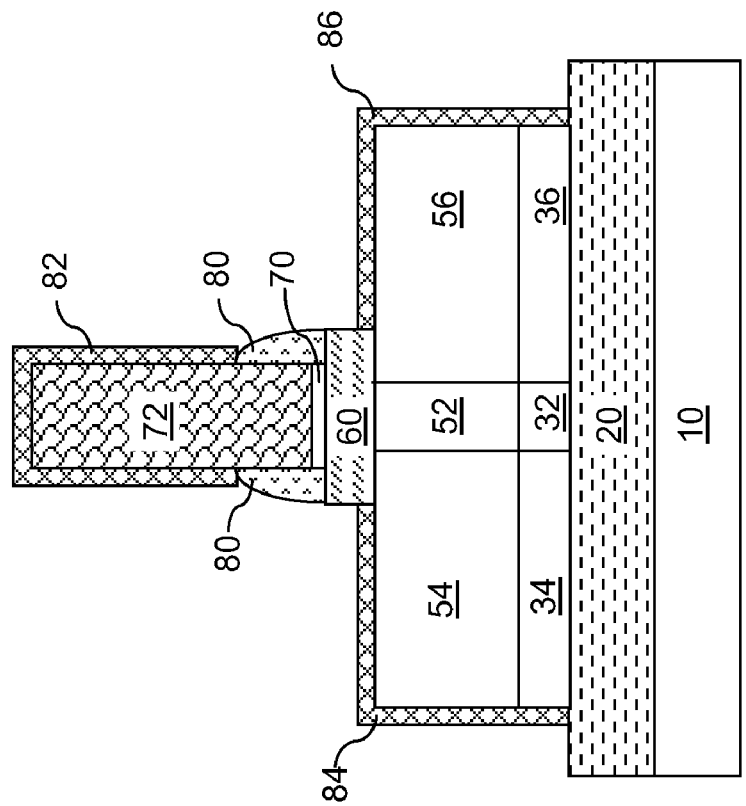
Figure 8A:
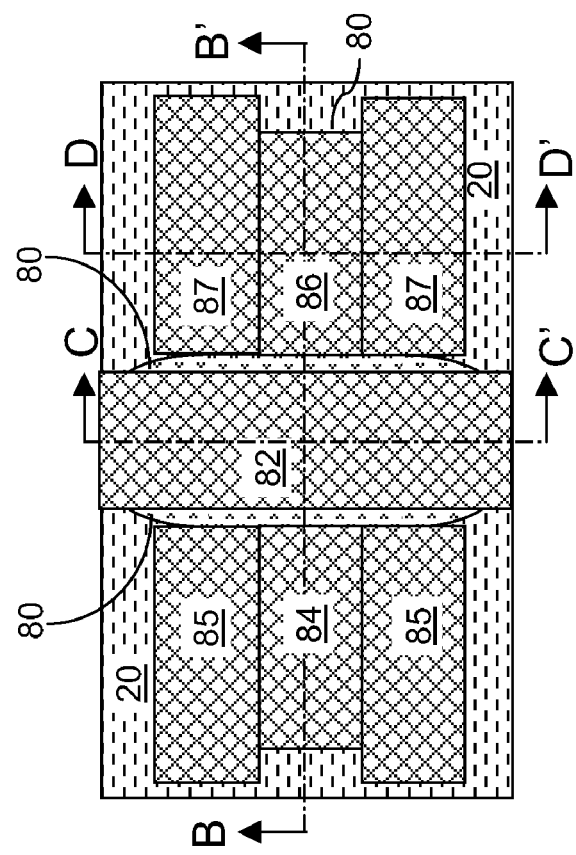

Referring to FIGS. 3A-3C, a second photoresist 69 is applied over the stack of the intermediate hardmask portion 60', the intermediate upper semiconductor portion 50', and the planar semiconductor portion 30 and the buried insulator layer 20 and lithographically patterned in the shape of a semiconductor fin to be subsequently formed. The shape of the semiconductor fin may be substantially rectangular. The pattern in the second photoresist 69 is transferred into the stack of the intermediate hardmask portion 60' and the intermediate upper semiconductor portion 50' by an anisotropic etch. The anisotropic etch is selective to the material of the planar semiconductor portion 30, i.e., the anisotropic etch removes the semiconductor material of the intermediate upper semiconductor portion 50', but does not remove the semiconductor material of the planar semiconductor portion 30 in any substantial manner.

The remaining portion of the intermediate hardmask portion 60' comprises a hardmask portion 60. The remaining portion of the intermediate upper semiconductor portion 50' comprises a semiconductor fin 50. The planar semiconductor portion 30 are not changed since the anisotropic etch is selective to the planar semiconductor portion 30.

The planar semiconductor portion 30 has a first width w1 and a first height h1. The first width w1 is greater than a critical dimension, which is a minimum dimension that may be printed lithographically. The first width w1 may be from about 30 nm to about 600 nm, and typically from about 60 nm to about 200 nm, although lesser and greater dimensions are also contemplated herein. The first height h1 may be from about 10 nm to about 150 nm, and typically from about 20 nm to about 60 nm.

The semiconductor fin 50 has a second width w2 and a second height h2. The second width w2 may be the same as, or may be greater than, the critical dimension. The second width w2 may be from about 20 nm to about 150 nm, and typically from about 30 nm to about 120 nm, although lesser and greater dimensions are also contemplated herein. The second height h2 may be from about 30 nm to about 400 nm, and typically from about 60 nm to about 200 nm.

Preferably, the planar semiconductor portion 30 and the semiconductor fin 50 have the same lengths L, which may be effected by patterning the second photoresist 69 so that the edges of the second photoresist 69 overlies the widthwise edges of the intermediate hardmask portion 60' and the intermediate upper semiconductor portion 50'.

Referring to FIGS. 4A-4D, a gate cap portion 74, a gate electrode 72, and a gate dielectric 70 are formed over a middle portion of the semiconductor fin 50 and a middle portion of the planar semiconductor portion 30 by deposition and patterning of a gate dielectric layer, a gate electrode layer, and a gate cap dielectric layer.

Specifically, a gate dielectric layer is formed on the sidewalls of the semiconductor fin 50, the horizontal top surfaces of the planar semiconductor portion 30, and the sidewalls of the planar semiconductor portion 30. The gate dielectric layer laterally surrounds the sidewalls of the semiconductor fin 50, covers the entirety of the top surfaces of the planar semiconductor portion 30, and laterally surrounds the sidewalls of the planar semiconductor portion 30. Thus, the gate dielectric layer is of unitary construction, i.e., the entirety of the gate dielectric layer over the sidewalls of the semiconductor fin 50, the top surfaces of the planar semiconductor portion 30, and the sidewalls of the planar semiconductor portion 30 is contiguous.

In one case, the gate dielectric layer comprises a dielectric material formed by thermal conversion of a portion of the semiconductor fin, such as silicon oxide or silicon nitride. Thermal oxidation, thermal nitridation, plasma oxidation, plasma nitridation, or a combination thereof may be employed to form the gate dielectric layer. In this case, the gate dielectric layer is formed only on the sidewalls of the semiconductor fin 30, the horizontal top surfaces of the planar semiconductor portion 30, and the sidewalls of the planar semiconductor portion 30.

In another case, the gate dielectric layer may comprise a high-k dielectric material having a dielectric constant greater than 3.9, i.e., the dielectric constant of silicon oxide. The high-k dielectric material may comprise a dielectric metal oxide containing a metal and oxygen. Preferably, the dielectric constant of the high-k material is greater than or about 4.0. More preferably, the dielectric constant of the high-k dielectric material is greater than the dielectric constant of silicon nitride, which is about 7.5. Even more preferably, the dielectric constant of the high-k dielectric material is greater than 8.0. The high-k dielectric materials are also known in the art as high-k gate dielectric materials, which include dielectric metal oxides, alloys thereof, and silicate alloys thereof. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. Optionally, an interfacial layer (not shown), for example, silicon oxide, can be formed by chemical oxidation or thermal oxidation before the high-k dielectric material is deposited.

A gate conductor layer is deposited on the gate dielectric layer, for example, by chemical vapor deposition (CVD). The gate conductor layer may comprise a doped semiconductor material or a metallic material. Non-limiting examples of the exemplary semiconductor materials include amorphous silicon, polysilicon, amorphous silicon germanium alloy, or a polycrystalline silicon germanium alloy. Non-limiting examples of the metallic materials include W, Ta, TiN, ZrN, HfN, VN, NbN, TaN, WN, TiAlN, TaC, TaMgC, TaCN, other conductive refractory metal nitrides, and an alloy thereof. The gate conductor layer may be formed by chemical vapor deposition (CVD), physical vapor deposition (PVD), atomic layer deposition (ALD), vacuum evaporation, etc. The thickness of the gate conductor layer may be from about 20 nm to about 300 nm, and preferably from about 40 nm to about 150 nm.

A gate cap dielectric layer is formed over the gate conductor layer, for example, by chemical vapor deposition (CVD). The gate cap dielectric layer comprises a dielectric material such as silicon oxide, silicon nitride, silicon oxynitride, or a combination thereof. The thickness of the gate dielectric layer may be from about 10 nm to about 200 nm, and typically from about 20 nm to about 100 nm, although lesser and greater thicknesses are contemplated herein.

The stack of the gate cap dielectric layer, the gate conductor layer, and the gate dielectric layer is lithographically patterned by application of a photoresist and patterning followed by an anisotropic etch. Employing the patterned photoresist as an etch mask, the anisotropic etch may remove the exposed portions of the gate cap dielectric layer and the gate conductor layer selective to the gate dielectric layer. The exposed portions of the gate dielectric layer may be subsequently removed selective to the semiconductor material of the semiconductor fin 50 and the planar semiconductor layer 30. The remaining portions of the gate cap dielectric layer, the gate conductor layer, and the gate dielectric layer constitute the gate cap portion 74, the gate electrode 72, and the gate dielectric 70, respectively.

Referring to FIGS. 5A-5D, source regions and drain regions are formed employing the stack of the gate cap portion 74, the gate electrode 72, and the gate dielectric 70 as an implantation mask. Specifically, dopants of a second conductivity type, which is the opposite of the first conductivity type, are implanted into the semiconductor fin 50 and the planar semiconductor portion 30 employing the stack of the gate cap portion 74, the gate electrode 72, and the gate dielectric 70 as the implantation mask to form a fin source region 54 and a fin drain region 56 in the semiconductor fin 50, and a planar source region 34 and a planar drain region 36 in the planar semiconductor portion 30. The unimplanted portion of the semiconductor fin 50 constitutes a fin body region 52 having a doping of the first conductivity type. The unimplanated portion of the planar semiconductor portion 30 constitutes a planar body region 32 having a doping of the first conductivity type. Halo implantations may be performed into the semiconductor fin 50 and the planar semiconductor portion 30 to adjust threshold voltages of field effect transistors that comprises the semiconductor fin 50 and the planar semiconductor portion 30.

Since ion implantation is performed employing the stack of the gate cap portion 74, the gate electrode 72, and the gate dielectric 70 and/or the dielectric spacer 80, the lateral extent of the fin body region 52 and the planar body region 32 is self-aligned with an offset to the edges of the gate electrode 72. Therefore, an edge of the fin source region 54 and an edge of the planar source region 34 are aligned to an edge of the gate electrode 72 with an offset. An edge of the fin drain region 56 and an edge of the planar drain region 36 are aligned to another edge of the gate electrode 72 with an offset.

A dielectric spacer 80 is formed by a conformal deposition of a dielectric material layer and an anisotropic etch, which removes horizontal portions of the dielectric material layer. The remaining portions of the dielectric material layer constitute the dielectric spacer 80. The dielectric spacer 80 may comprise silicon oxide, silicon nitride, silicon oxynitride, or a stack thereof. In a preferred example, the dielectric spacer 80 comprises silicon oxide. The dielectric spacer 80 laterally abuts the sidewalls of the entirety of the gate dielectric 70, the entirety of the gate electrode 72, and the entirety of the sidewalls of the semiconductor fin (52, 54, 56). The dielectric spacer 80 laterally abuts a lower part of the gate cap portion 74 and a lower part of the hardmask portion 60. The lateral thickness of the dielectric spacer may be form about 5 nm to about 100 nm, and typically from about 10 nm to about 50 nm, although lesser or greater thicknesses are also contemplated herein. Additional dopants of the second conductivity type may be implanted into the fin source region 54, the fin drain region 56, the planar source region 34, and the planar drain region 36 to reduce resistivity of the implanted regions.

The dielectric spacer 80 functions as a masking layer to prevent growth of a semiconductor material on the sidewalls of the gate electrode 72 and on the sidewalls of the semiconductor fin (52, 54, 56) to enable selective epitaxial growth of a semiconductor material only on exposed surfaces of the planar source region 34 and the planar drain region 36. The dielectric spacer 80 may be formed prior to, or after the ion implantation employed to form the planar source region 34, the planar drain region 36, the fin source region 54, and the fin drain region 56. In case formation of the dielectric spacer precedes formation of the planar source region 34, the planar drain region 36, the fin source region 54, and the fin drain region 56, edges of the planar source region 34, the planar drain region 36, the fin source region 54, and the fin drain region 56 may be substantially self-aligned to outer edges of the dielectric spacer 80 i.e., edges of the dielectric spacer 80 that does not abut the gate electrode 72.

A pair of top surfaces of the planar source region 34 and a pair of top surfaces of the drain region 36 are exposed. The entirety, or upper portions, of the sidewalls of the planar source region 34, the planar drain region 36 may be exposed depending on the amount of recess etch, the thickness of the gate cap portion 74, and the thickness of the hardmask portion 60. Preferably, the entirety of the sidewalls of the planar source region 34 and the planar drain region 36 is exposed A pair of sidewalls of the planar source region 34 in the lengthwise direction and a pair of sidewalls of the drain region 36 in the lengthwise direction are also exposed. Further, a pair of sidewalls of the planar source region 34 in the widthwise direction and a pair of sidewalls of the drain region 36 in the widthwise direction are also exposed.

Referring to FIGS. 6A-6D, a pair of epitaxial raised source portions 34X and a pair of epitaxial raised drain portions 36X are formed by selective epitaxy directly on exposed surfaces of the planar source region 34 and exposed surfaces of the planar drain region 36, respectively. Use of selective epitaxy prevents growth of a semiconductor material on dielectric surfaces, i.e., the surfaces of the insulator layer 20, the surfaces of the hardmask portion 60, the surfaces of the gate cap portion 74, and the surfaces of the dielectric spacer 80. The pair of epitaxial raised source portions 34X and the pair of epitaxial raised drain portions 36X comprise a semiconductor material having a doping of the second conductivity type. Preferably, the pair of epitaxial raised source portions 34X and the pair of epitaxial raised drain portions 36X are formed with in-situ doping so that dopants of the second conductivity type are incorporated into the pair of epitaxial raised source portions 34X and the pair of epitaxial raised drain portions 36X during deposition.

The crystal structure of the epitaxial raised source portions 34X is epitaxially aligned to the crystal structure of the planar source region 34. The crystal structure of the epitaxial raised drain portions 36X is epitaxially aligned to the crystal structure of the planar drain region 36. Preferably, the entirety of the planar semiconductor portion (32, 34, 36), the epitaxial raised source portions 34X, and the epitaxial raised drain portion 36X are epitaxially aligned. The planar semiconductor portion (32, 34, 36) may, or may not, be aligned to the semiconductor fin (52, 54, 56). Each of the epitaxial raised source portions 34X and the epitaxial raised drain portion 36X has an inverted-L shaped vertical cross-sectional area. The thickness of the epitaxial raised source portions 34X and the epitaxial raised drain portion 36X, as measured over a top surface of the planar source region 34 or the planar drain region 36 or on the sidewalls of the planar source region 34 or the planar drain region 36, may be from about 5 nm to about 100 nm, and typically from about 10 nm to about 50 nm, although lesser and greater thicknesses are explicitly contemplated herein.

Referring to FIGS. 7A-7D, the gate cap portion 74 and the hard mask portion 60 are recessed selective to the dielectric spacer 80. In case the gate cap portion 74 and the hard mask portion 60 comprise silicon nitride and the dielectric spacer 80 comprises silicon oxide, an etch that selectively removes silicon nitride to silicon oxide may be employed. The etch may be an isotropic etch or an anisotropic etch. For example, if the gate cap portion 74 and the hard mask portion 60 comprise silicon nitride and the dielectric spacer 80 comprises silicon oxide, a wet etch employing hot phosphoric acid may be employed to remove the exposed portions of the gate cap portion 74 and the hard mask portion 60 selective to the dielectric spacer 80. The etch that removes the exposed portions of the gate cap portion 74 and the hard mask portion 60 is selective to the semiconductor material of the semiconductor fin (52, 54, 56) and the semiconductor material of the planar semiconductor portion (32, 34, 46).

Referring to FIGS. 8A-8D, another etch is employed to remove the dielectric spacer 80 selective to the semiconductor material of the semiconductor fin (52, 54, 56), the semiconductor material of the planar semiconductor portion (32, 34, 46), and the gate electrode 72.

Various metal semiconductor alloy regions are formed by applying and reacting a metal layer with exposed semiconductor materials. Unreacted portions of the metal layer are subsequently removed. Specifically, a metal semiconductor alloy fin source portion 84 is formed directly on the fin source region 54 and a metal semiconductor alloy fin drain portion 86 is formed directly on the fin drain region 56. A pair of metal semiconductor alloy raised source portions 85 are formed directly on the pair of epitaxial raised source portions 34X, and a pair of metal semiconductor alloy raised drain portions 87 are formed directly on the pair of epitaxial raised drain portions 36X. The metal semiconductor alloy fin source portion 84 abuts each of the pair of metal semiconductor alloy raised source portions 85 with a seam. This seam adjoins the upper surface of the planar source region 34. The metal semiconductor alloy fin drain portion 86 abuts each of the pair of metal semiconductor alloy raised drain portions 87 with a seam. This seam adjoins the upper surface of the planar drain region 36.

The first exemplary semiconductor structure of FIGS. 8A-8D comprises a hybrid field effect transistor of the present invention. The hybrid field effect transistor comprises a fin field effect transistor comprising the semiconductor fin (52, 54, 56) and the overlying portion of the gate dielectric 70 and the gate electrode 72. The hybrid field effect transistor further comprises a planar field effect transistor comprising the planar semiconductor portion (32, 34, 36) and the overlying portion of the gate dielectric and the gate electrode 72. The gate dielectric and the gate electrode of the fin field effect transistor and the planar field effect transistor are formed integrally. While the first height h1 and the second height h2 are typically fixed by processing parameters selected during the manufacturing process, the second width w2 may be adjusted continuously in the design to accommodate any on-current target for the hybrid field effect transistor. The compositions and crystallographic orientations of the semiconductor fin (52, 54, 56) and the planar semiconductor portion (32, 34, 36) may be independently selected to optimize the performance of the hybrid field effect transistor.

The present invention may be practiced such that a plurality of semiconductor structures, each comprising a stack of a semiconductor fin and a planar semiconductor portion, is formed on the same SOI substrate. In this case, the first height h1 and the second height h2 may be the same across the plurality of semiconductor structures. The second width w2 may be the same, or different. The first width w1 may vary continuously across the various stacks. A hybrid field effect transistor, which comprises a fin field effect transistor formed on the semiconductor fin and a planar field effect transistor formed on the planar semiconductor portion, has an on-current comprising a first component from the fin field effect transistor and a second component from the planar field effect transistor. While the first component is not highly sensitive to a change in the second width w2, the second component is affected directly by changes in the first width w1. The on-current of the hybrid field effect transistor may be modulated continuously by changing the first width w1.

Referring to FIGS. 9A and 9B, a second exemplary semiconductor structure according to a second embodiment of the present invention comprises a semiconductor-on-insulator (SOI) substrate 8 having the same structure and composition as in the first embodiment.

A dielectric etch stop layer 140L is formed on the top surface of the SOI layer 30L. The dielectric etch stop layer 140L comprises a dielectric material such as silicon oxide, silicon nitride, silicon oxynitride, or a stack thereof. The dielectric etch stop layer 140L may be formed by deposition of a dielectric material or by conversion of a semiconductor material on the SOI layer by thermal oxidation, thermal nitridation, plasma oxidation, plasma nitridation, or a combination thereof. The thickness of the dielectric etch stop layer 140L may be from about 1 nm to about 50 nm, and preferably from about 2 nm to about 20 nm, although lesser and greater thicknesses are also contemplated herein.

An upper semiconductor layer 50L is formed on the dielectric etch stop layer 140L. The upper semiconductor layer 50L may be formed by bonding of a semiconductor layer on another handle substrate (not shown) to the dielectric etch stop layer 140L on the SOI substrate 8. For example, a hydrogen implanted layer in a semiconductor substrate may be employed to bond a semiconductor layer having a constant thickness such that the semiconductor layer is cleaved from the other handle substrate at the hydrogen implanted layer. Methods of bonding a semiconductor layer to an SOI substrate is known in the art. Preferably, the upper semiconductor layer 50L comprises a single crystalline material. In this case, the upper semiconductor layer 50L may have the same crystallographic orientations and surface orientation as, or different crystallographic orientations and surface orientation than, the SOI layer 30L.

The upper semiconductor layer 50L may have the same composition as, or a different composition than, the SOI layer 30L. The upper semiconductor layer 50L and the SOI layer 30L may comprise the same semiconductor materials, or may comprise different materials. The upper semiconductor layer 50L and the SOI layer 30L may have the same dopant concentration and species, or different dopant concentrations and/or in dopant species.

Preferably, the upper semiconductor layer 50L has a doping of the first conductivity type, i.e., a doping of the same conductivity type as the planar semiconductor layer 30. For example, the concentration of the electrical dopants may be from about $1.0 \times 10^{15}$ atoms/cm$^3$ to about $1.0 \times 10^{19}$ atoms/cm$^3$.

A hardmask layer 60L is formed on the upper semiconductor layer 50L in the same manner as in the first embodiment. The hardmask layer 60L may have the same composition and thickness as in the first embodiment.

Referring to FIGS. 10A and 10B, a first photoresist 67 is applied over the hardmask layer 60L and lithographically patterned in the shape of a planar semiconductor portion to be subsequently formed. The shape of the planar semiconductor portion may be substantially rectangular. The pattern in the first photoresist 67 is transferred into the stack of the hardmask layer 60L, the upper semiconductor layer 50L, the dielectric etch stop layer 140L, and the SOI layer 30L by an anisotropic etch, which may be a reactive ion etch. The remaining portion of the hardmask layer 60L comprises an intermediate hardmask portion 60'. The remaining portion of the upper semiconductor layer 50L comprises an intermediate upper semiconductor portion 50'. The remaining portion of the dielectric etch stop layer 140L comprises an intermediate dielectric etch stop portion 140'. The remaining portion of the SOI layer 30 comprises a planar semiconductor portion 30. The anisotropic etch is preferably selective to the buried insulator layer 20. The sidewalls of the intermediate hardmask portion 60', the intermediate upper semiconductor portion 50', the intermediate dielectric etch stop portion 140', and the planar semiconductor portion 30 are substantially vertically coincident. The first photoresist 67 is subsequently removed.

Figure 11C:
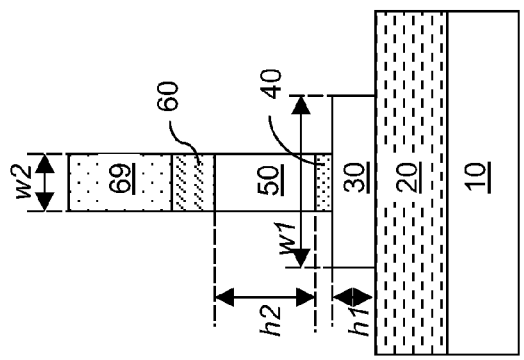
Figure 11A:
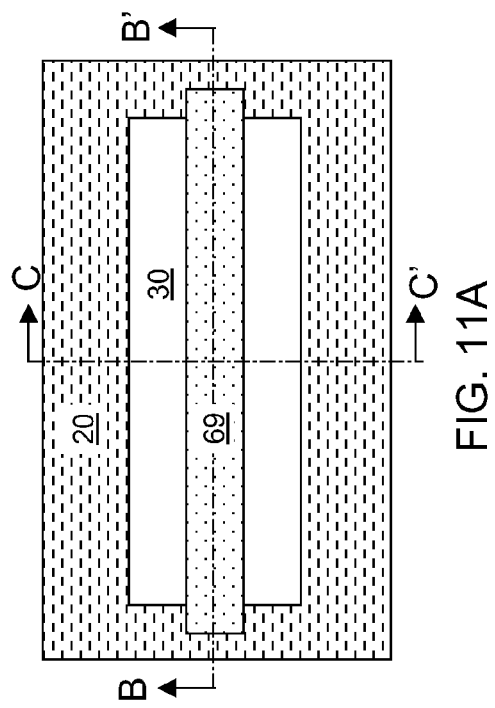
Figure 11B:
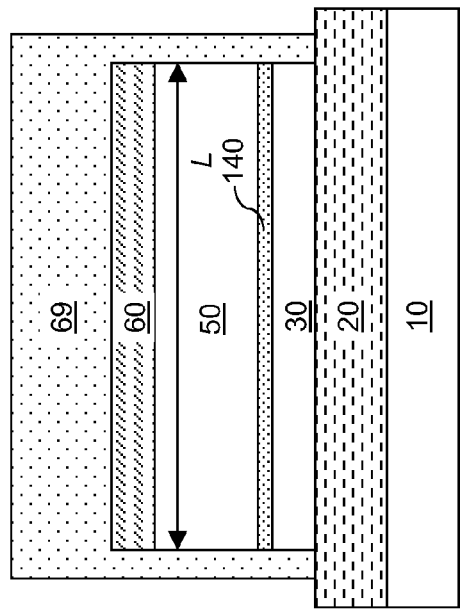
Figure 12B:
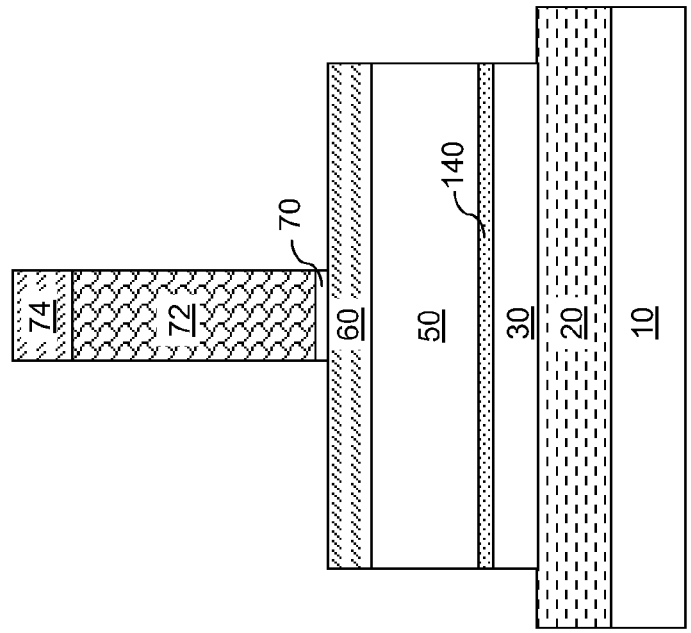
Figure 12A:
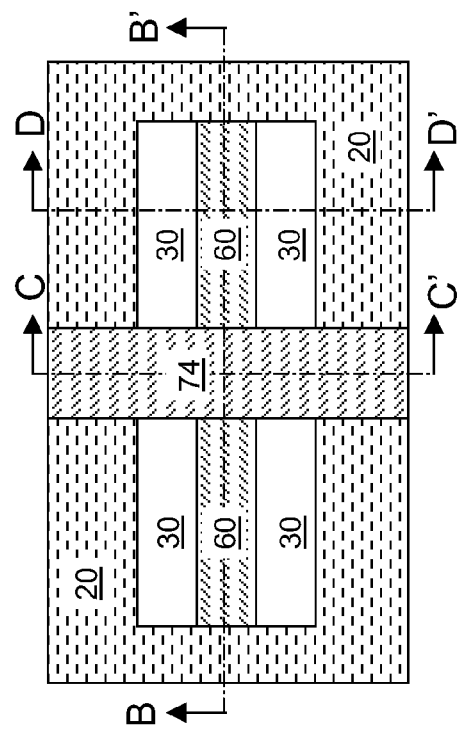
Figure 12D:
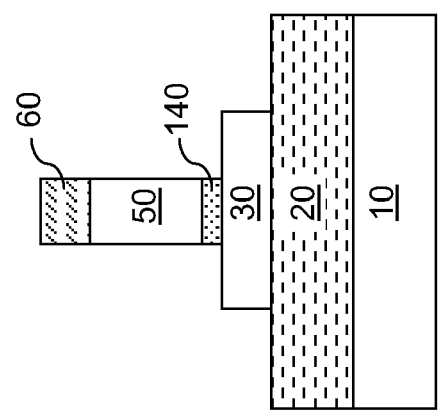
Figure 12C:
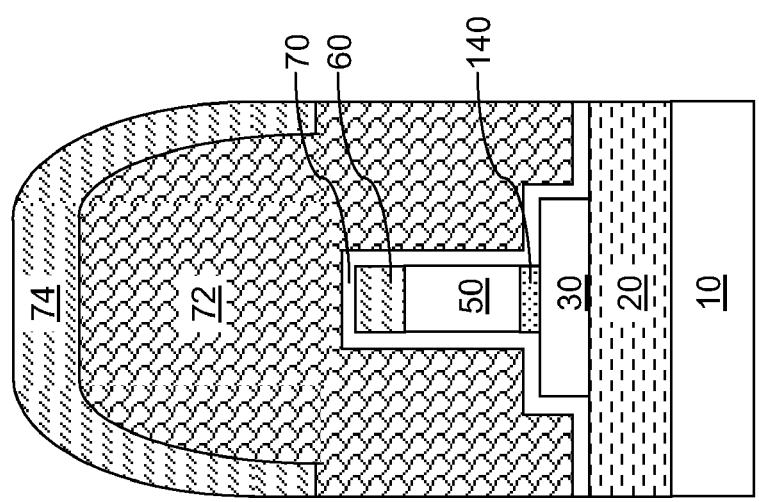
Figures 13A, 13B:
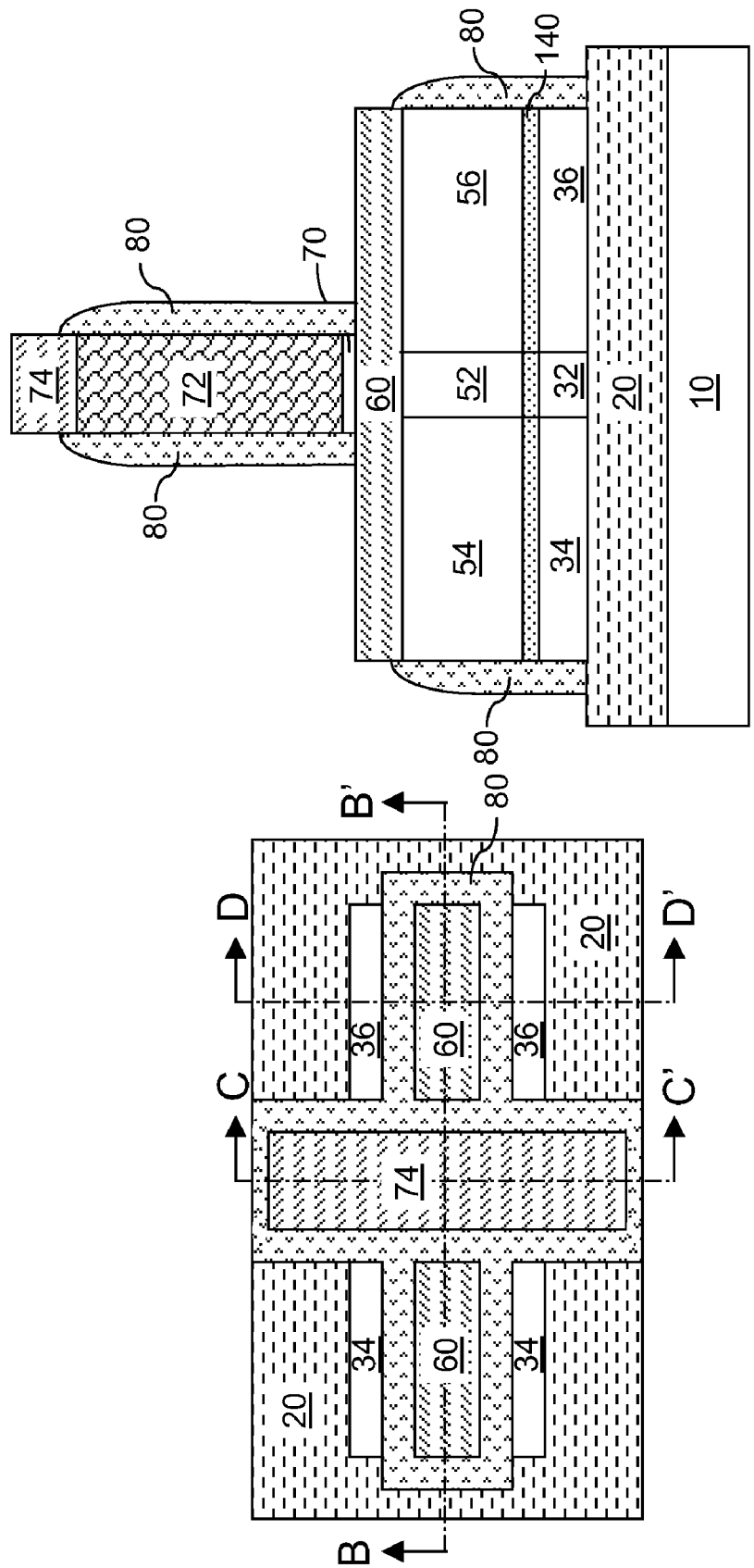
Figure 13D:
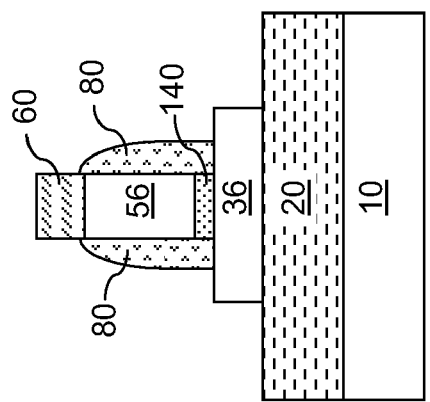
Figure 13C:
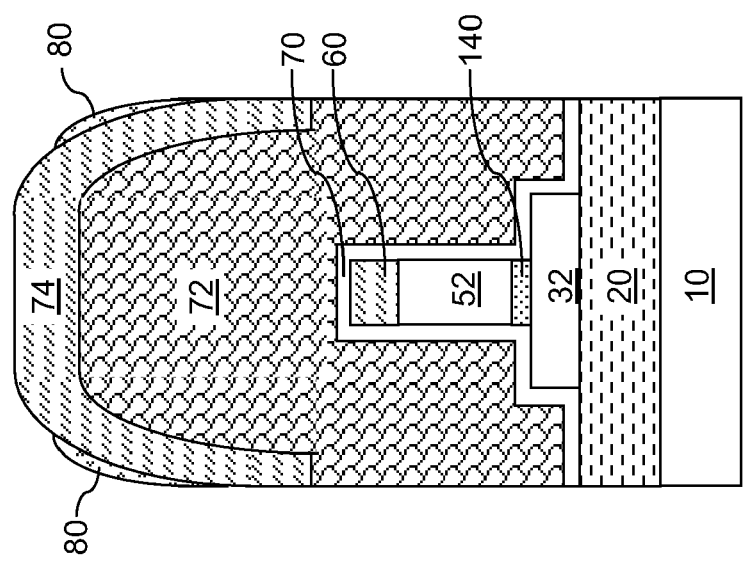
Figures 14A, 14B:
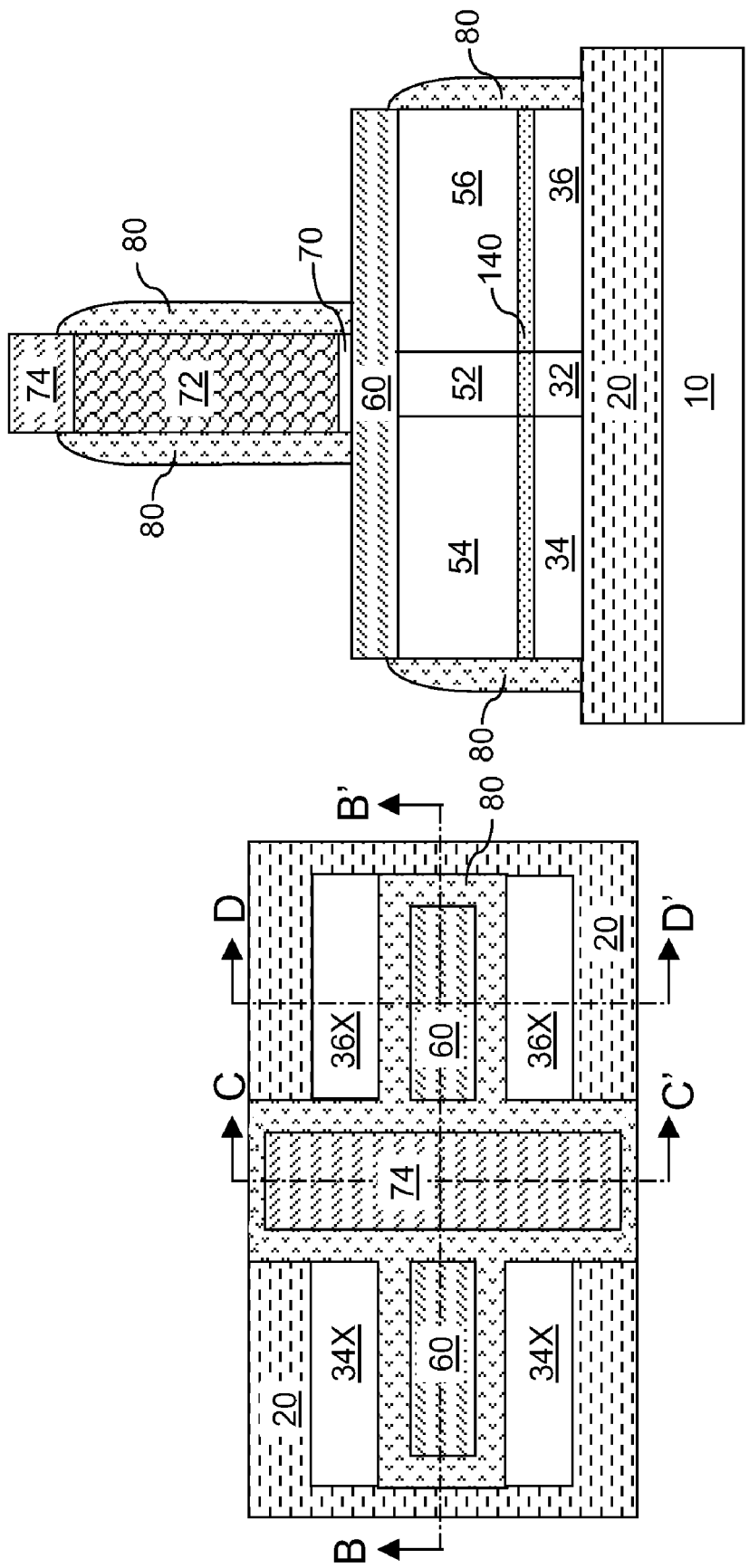
Figure 15B:
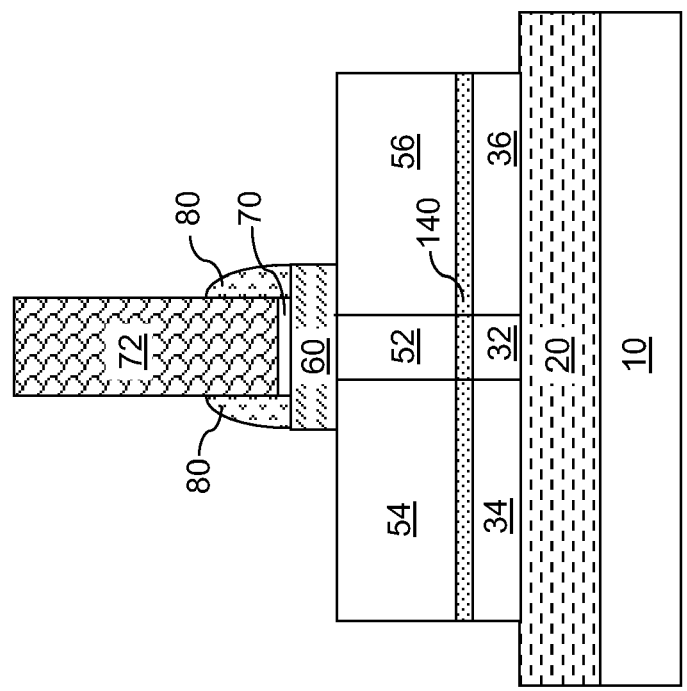
Figure 15A:
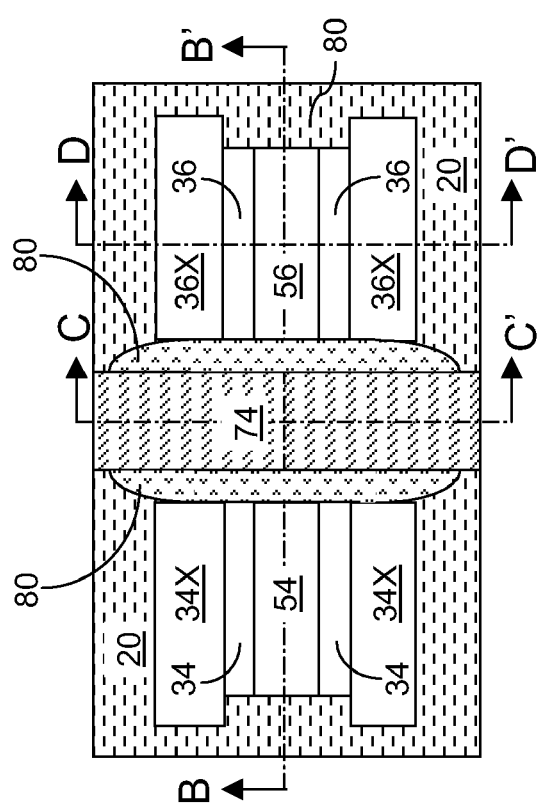
Figure 15D:
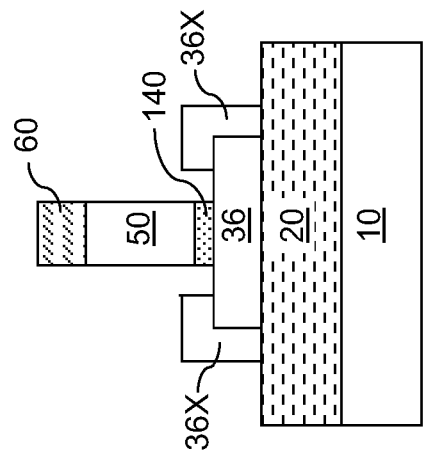
Figure 15C:
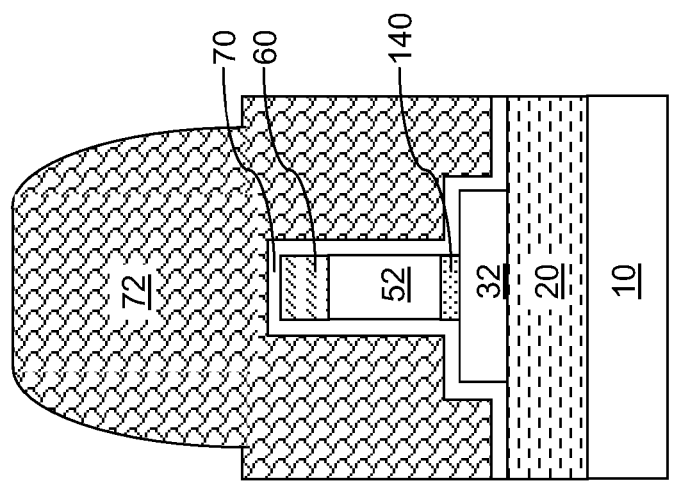
Figure 16B:
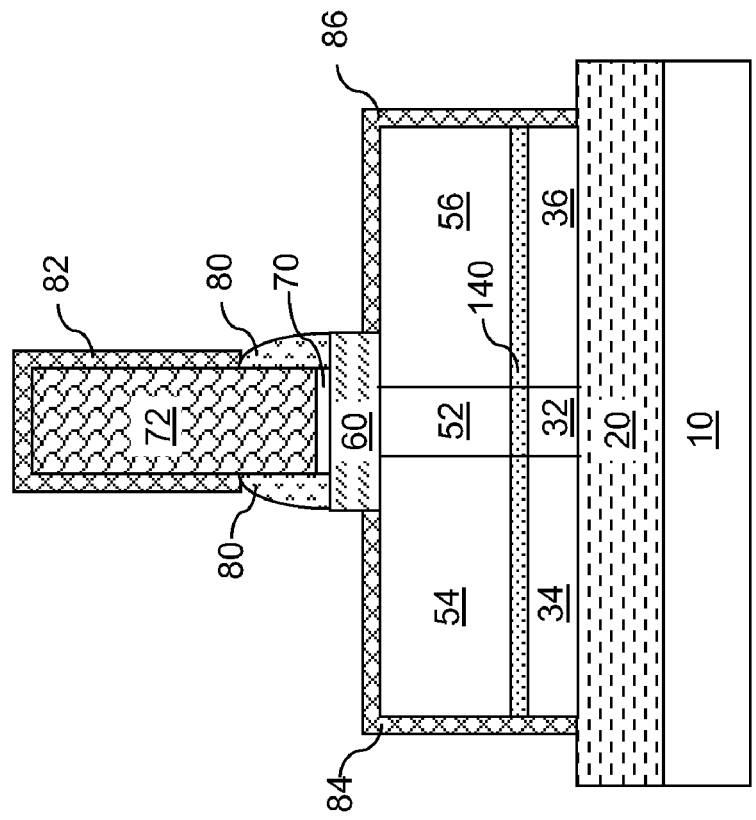
Figure 16A:
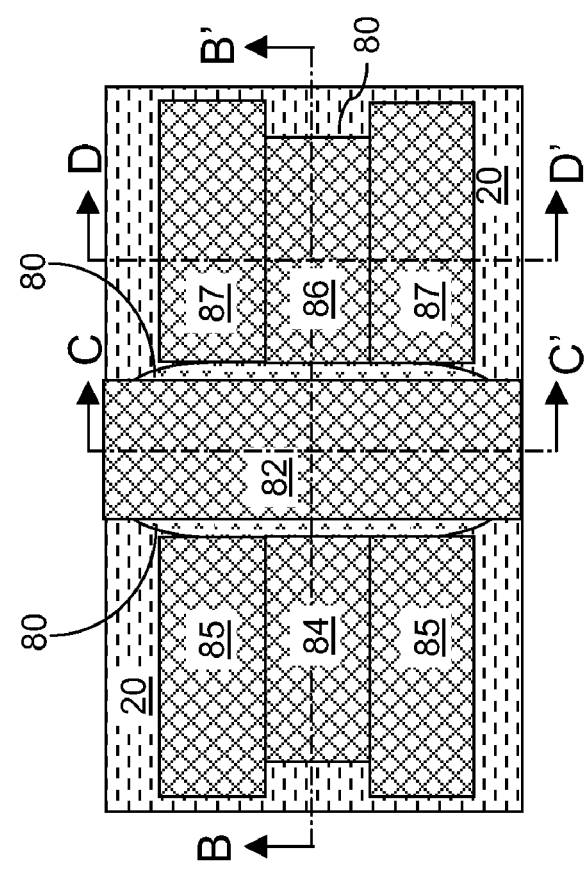
Figure 16D:
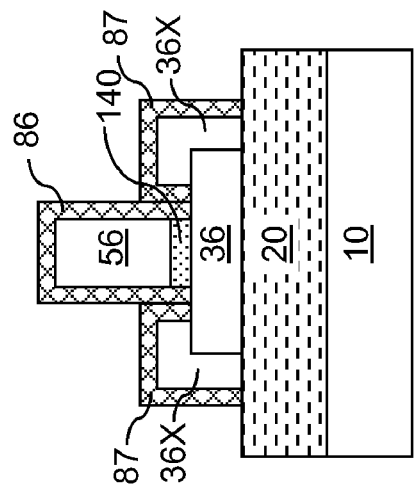
Figure 16C:
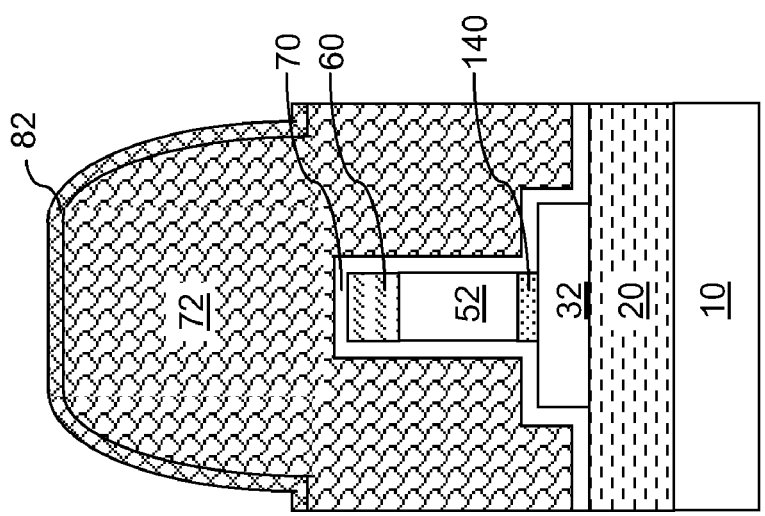

Referring to FIGS. 11A-11C, a second photoresist 69 is applied over the stack of the intermediate hardmask portion 60', the intermediate upper semiconductor portion 50', the intermediate dielectric etch stop portion 140', and the planar semiconductor portion 30 and the buried insulator layer 20 and lithographically patterned in the shape of a semiconductor fin to be subsequently formed. The shape of the semiconductor fin may be substantially rectangular. The pattern in the second photoresist 69 is transferred into the stack of the intermediate hardmask portion 60', the intermediate dielectric etch stop portion 140', and the intermediate upper semiconductor portion 50' by an anisotropic etch. Preferably, the anisotropic etch selective to the material of the intermediate dielectric etch stop portion 140'.

The remaining portion of the intermediate hardmask portion 60' comprises a hardmask portion 60. The remaining portion of the intermediate upper semiconductor portion 50' comprises a semiconductor fin 50. The exposed portions of the intermediate dielectric etch stop portion 140' is subsequently removed selective to the material of the planar semiconductor portion 30 by an etch, which may be anisotropic or isotropic. Not necessarily but preferably, the etch is selective to the semiconductor material of the semiconductor fin 50. The remaining portion of the intermediate dielectric etch stop portion 140' constitutes a dielectric material portion 140. The second photoresist 69 is removed prior to, or after, the etch of the exposed portions of the intermediate dielectric etch stop portion 140'.

The planar semiconductor portion 30 has a first width w1 and a first height h1, which have the same characteristics as in the first embodiment. The semiconductor fin 50 has a second width w2 and a second height h2, which also have the same characteristics as in the first embodiment. Preferably, the planar semiconductor portion 30 and the semiconductor fin 50 have the same lengths L as in the first embodiment. In this case, the dielectric portion 140 has substantially the same length as the semiconductor fin 50.

Referring to FIGS. 12A-12D, a gate cap portion 74, a gate electrode 72, and a gate dielectric 70 are formed over a middle portion of the semiconductor fin 50 and a middle portion of the planar semiconductor portion 30 by deposition and patterning of a gate dielectric layer, a gate electrode layer, and a gate cap dielectric layer in the same manner as in the first embodiment.

Referring to FIGS. 13A-13D, source regions and drain regions are formed employing the stack of the gate cap portion 74, the gate electrode 72, and the gate dielectric 70 as an implantation mask. Specifically, dopants of a second conductivity type, which is the opposite of the first conductivity type, are implanted into the semiconductor fin 50 and the planar semiconductor portion 30 employing the stack of the gate cap portion 74, the gate electrode 72, and the gate dielectric 70 as the implantation mask to form a fin source region 54 and a fin drain region 56 in the semiconductor fin 50, and a planar source region 34 and a planar drain region 36 in the planar semiconductor portion 30. The unimplanted portion of the semiconductor fin 50 constitutes a fin body region 52 having a doping of the first conductivity type. The unimplanated portion of the planar semiconductor portion 30 constitutes a planar body region 32 having a doping of the first conductivity type. Halo implantations may be performed into the semiconductor fin 50 and the planar semiconductor portion 30 to adjust threshold voltages of field effect transistors that comprises the semiconductor fin 50 and the planar semiconductor portion 30.

A dielectric spacer 80 is formed in the same manner as in the first embodiment. Additional dopants of the second conductivity type may be implanted into the fin source region 54, the fin drain region 56, the planar source region 34, and the planar drain region 36 to reduce resistivity of the implanted regions. Since ion implantation is performed employing the stack of the gate cap portion 74, the gate electrode 72, and the gate dielectric 70 and/or the dielectric spacer 80, the lateral extent of the fin body region 52 and the planar body region 32 is self-aligned with an offset to the edges of the gate electrode 72. Therefore, an edge of the fin source region 54 and an edge of the planar source region 34 are aligned to an edge of the gate electrode 72 with an offset. An edge of the fin drain region 56 and an edge of the planar drain region 36 are aligned to another edge of the gate electrode 72 with an offset.

Referring to FIGS. 14A-14D, a pair of epitaxial raised source portions 34X and a pair of epitaxial raised drain portions 36X are formed by selective epitaxy directly on exposed surfaces of the planar source region 34 and exposed surfaces of the planar drain region 36 in the same manner as in the first embodiment.

The crystal structure of the epitaxial raised source portions 34X is epitaxially aligned to the crystal structure of the planar source region 34. The crystal structure of the epitaxial raised drain portions 36X is epitaxially aligned to the crystal structure of the planar drain region 36. Preferably, the entirety of the planar semiconductor portion (32, 34, 36), the epitaxial raised source portions 34X, and the epitaxial raised drain portion 36X are epitaxially aligned. The planar semiconductor portion (32, 34, 36) is not epitaxially aligned to the semiconductor fin (52, 54, 56) since bonding is employed to bring the SOI layer 30 and the upper semiconductor layer 50 with the dielectric etch stop layer 140L therebetween as described above. Each of the epitaxial raised source portions 34X and the epitaxial raised drain portion 36X has an inverted-L shaped vertical cross-sectional area. The thickness of the epitaxial raised source portions 34X and the epitaxial raised drain portion 36X, as measured over a top surface of the planar source region 34 or the planar drain region 36 or on the sidewalls of the planar source region 34 or the planar drain region 36, may be from about 5 nm to about 100 nm, and typically from about 10 nm to about 50 nm, although lesser and greater thicknesses are explicitly contemplated herein.

Referring to FIGS. 15A-15D, the gate cap portion 74 and the hard mask portion 60 are recessed selective to the dielectric spacer 80 in the same manner as in the first embodiment.

Referring to FIGS. 16A-16D, various metal semiconductor alloy regions are formed by applying and reacting a metal layer with exposed semiconductor materials. Unreacted portions of the metal layer are subsequently removed. Specifically, a metal semiconductor alloy fin source portion 84 is formed directly on the fin source region 54 and a metal semiconductor alloy fin drain portion 86 is formed directly on the fin drain region 56. A pair of metal semiconductor alloy raised source portions 85 are formed directly on the pair of epitaxial raised source portions 34X, and a pair of metal semiconductor alloy raised drain portions 87 are formed directly on the pair of epitaxial raised drain portions 36X. The metal semiconductor alloy fin source portion 84 abuts each of the pair of metal semiconductor alloy raised source portions 85 with a seam. This seam adjoins the upper surface of the planar source region 34. The metal semiconductor alloy fin drain portion 86 abuts each of the pair of metal semiconductor alloy raised drain portions 87 with a seam. This seam adjoins the upper surface of the planar drain region 36.

The lateral abutting of the metal semiconductor alloy fin source portion 84 with the pair of metal semiconductor alloy raised source portions 85 enables low resistance connection between the fin source region 54 and the planar source region 34 through the pair of epitaxial raised source portions 34X despite their separation by the dielectric material layer 140. In the same manner, the lateral abutting of the metal semiconductor alloy fin drain portion 86 with the pair of metal semiconductor alloy raised drain portions 87 enables low resistance connection between the fin drain region 56 and the planar drain region 36 through the pair of epitaxial raised drain portions 36X despite their separation by the dielectric material layer 140.

The second exemplary semiconductor structure of FIGS. 16A-16D comprises a hybrid field effect transistor of the present invention. The hybrid field effect transistor of the second embodiment comprises a fin field effect transistor including the semiconductor fin (52, 54, 56) and a planar field effect transistor including the planar semiconductor portion (32, 34, 36) as the hybrid field effect transistor of the first embodiment. Unlike the hybrid field effect transistor of the first embodiment, however, the fin field effect transistor and the planar field effect transistor are physically separated by the dielectric material layer 140. The planar source region 34 and the fin source region 54 are electrically connected to each other. The planar drain region 36 and the fin drain region 56 are electrically connected to each other. However, the planar body region 32 and the fin body region 52 are electrically insulated from each other.

Referring to FIGS. 17A and 17B, a third exemplary semiconductor structure according to a third embodiment of the present invention comprises a semiconductor-on-insulator (SOI) substrate 8 having the same structure and composition as in the first embodiment.

A stack of a semiconductor etch stop layer 340L and an upper semiconductor layer 350L is formed on the top surface of the SOI layer 30L. Each of the semiconductor etch stop layer 340L and the upper semiconductor layer 350L comprises a semiconductor material. The semiconductor etch stop layer 340L has a different composition than the SOI layer 30L. Further, the semiconductor etch stop layer 340L has a different composition than the upper semiconductor layer 350L. The SOI layer 30L may have the same composition as, or different composition from, the upper semiconductor layer 350L. Preferably, each of the upper semiconductor layer 350L and the semiconductor etch stop layer 340L comprises a single crystalline material.

In one case, the stack of the semiconductor etch stop layer 340L and an upper semiconductor layer 350L may be formed by bonding of a stack of semiconductor layers on another handle substrate to the SOI layer 30L. The bonded stack of semiconductor layers constitutes the stack of semiconductor etch stop layer 340L and the upper semiconductor layer 350L. In this case, the semiconductor etch stop layer 340L may have the same crystallographic orientations and surface orientation as, or different crystallographic orientations and surface orientation than, the SOI layer 30L. The upper semiconductor layer 350L may have the same crystallographic orientations and surface orientation as, or different crystallographic orientations and surface orientation than, the SOI layer 30L. The semiconductor etch stop layer 340L may have the same crystallographic orientations and surface orientation as, or different crystallographic orientations and surface orientation than, the upper semiconductor layer 350L.

In another case, the semiconductor etch stop layer 340L may be epitaxially grown on the SOI layer 30L by epitaxy. The upper semiconductor layer 350L may be formed by bonding of a semiconductor layer on another handle substrate to the SOI layer 30L. The bonded semiconductor layer constitutes the upper semiconductor layer 350L. In this case, the semiconductor etch stop layer 340L has the same crystallographic orientations and surface orientation as the SOI layer 30L. The upper semiconductor layer 350L may have the same crystallographic orientations and surface orientation as, or different crystallographic orientations and surface orientation than, the SOI layer 30L.

In yet another case, the semiconductor etch stop layer 340L and the upper semiconductor layer 350L may be epitaxially grown on the SOI layer 30L by epitaxy. In this case, the upper semiconductor layer 350L, the semiconductor etch stop layer 340L, and the SOI layer 30L have the same crystallographic orientations and the same surface orientation.

The thickness of the semiconductor etch stop layer 340L may be from about 1 nm to about 100 nm, and preferably from about 2 nm to about 20 nm, although lesser and greater thicknesses are also contemplated herein.

The upper semiconductor layer 350L may have the same composition as, or a different composition than, the SOI layer 30L. The upper semiconductor layer 350L and the SOI layer 30L may comprise the same semiconductor materials, or may comprise different materials. The upper semiconductor layer 350L and the SOI layer 30L may have the same dopant concentration and species, or different dopant concentrations and/or in dopant species.

Preferably, the upper semiconductor layer 350L has a doping of the first conductivity type, i.e., a doping of the same conductivity type as the planar semiconductor layer 30. For example, the concentration of the electrical dopants may be from about $1.0 \times 10^{15}$ atoms/cm$^3$ to about $1.0 \times 10^{19}$ atoms/cm$^3$.

A hardmask layer 60L is formed on the upper semiconductor layer 350L in the third embodiment in the same manner as in the first embodiment. The hardmask layer 60L may have the same composition and thickness as in the first embodiment.

Referring to FIGS. 18A and 18B, a first photoresist 67 is applied over the hardmask layer 60L and lithographically patterned in the shape of a planar semiconductor portion to be subsequently formed. The shape of the planar semiconductor portion may be substantially rectangular. The pattern in the first photoresist 67 is transferred into the stack of the hardmask layer 60L, the upper semiconductor layer 350L, the semiconductor etch stop layer 340L, and the SOI layer 30L by an anisotropic etch, which may be a reactive ion etch.

The sidewalls of the patterned portions of the various semiconductor layers (30L, 340L, 350L) may have a non-zero slope from a vertical line, i.e., i.e., a non-zero angle between the sidewalls and a surface normal of the top surface of the SOI layer 30L. The remaining portion of the hardmask layer 60L comprises an intermediate hardmask portion 60'. The remaining portion of the upper semiconductor layer 350L constitutes a tapered upper semiconductor portion 350", which has sidewalls having a non-zero angle from the surface normal of the top surface of the SOI layer 30L. The remaining portion of the semiconductor etch stop layer 340L constitutes an intermediate semiconductor etch stop portion 340'. The remaining portion of the SOI layer 30 comprises a tapered planar semiconductor portion 30', which has other sidewall having a non-zero angle from the surface normal of the top surface of the SOI layer 30L. The anisotropic etch is preferably selective to the buried insulator layer 20. The first photoresist 67 is subsequently removed.

Figure 19C:
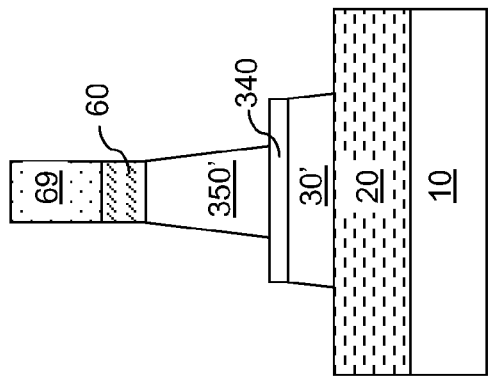
Figure 19A:
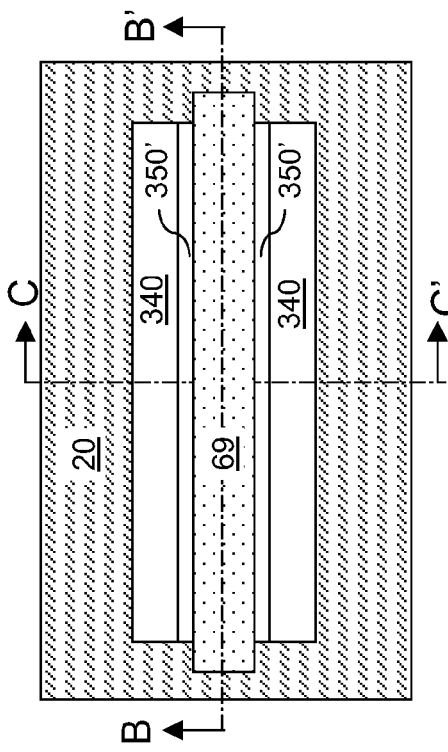
Figure 19B:
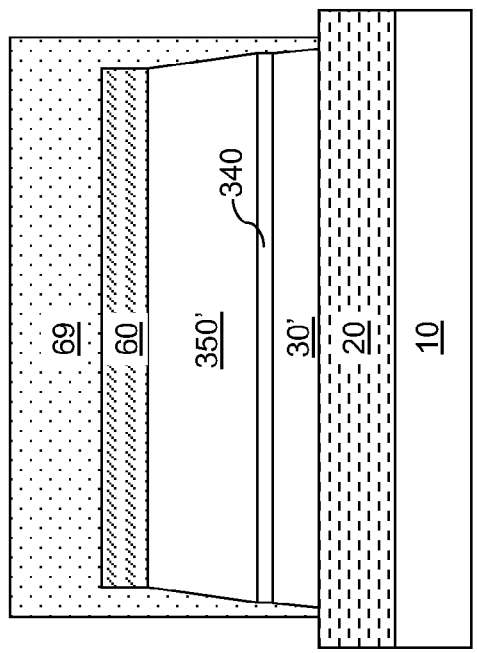
Figure 22B:
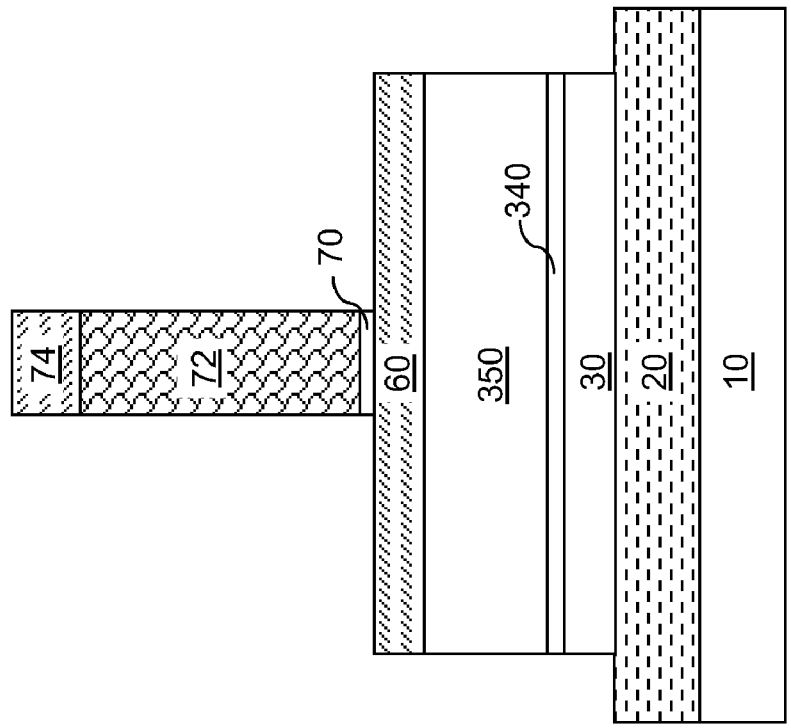
Figure 22A:
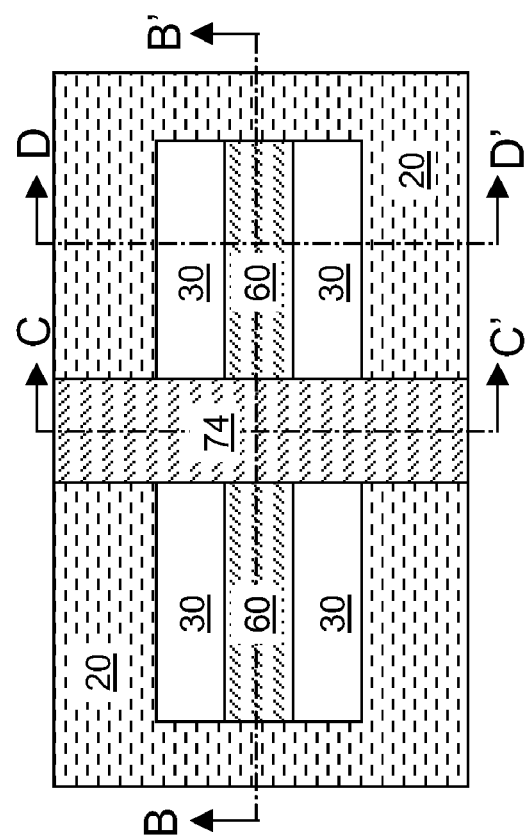
Figure 22D:
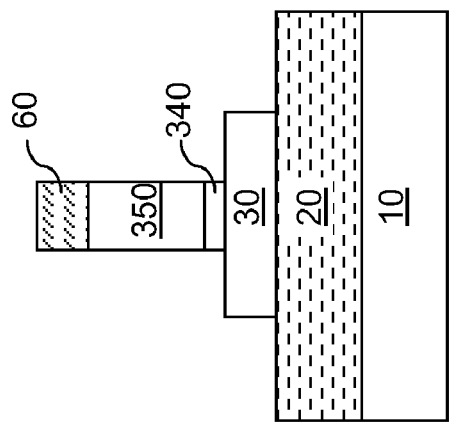
Figure 22C:
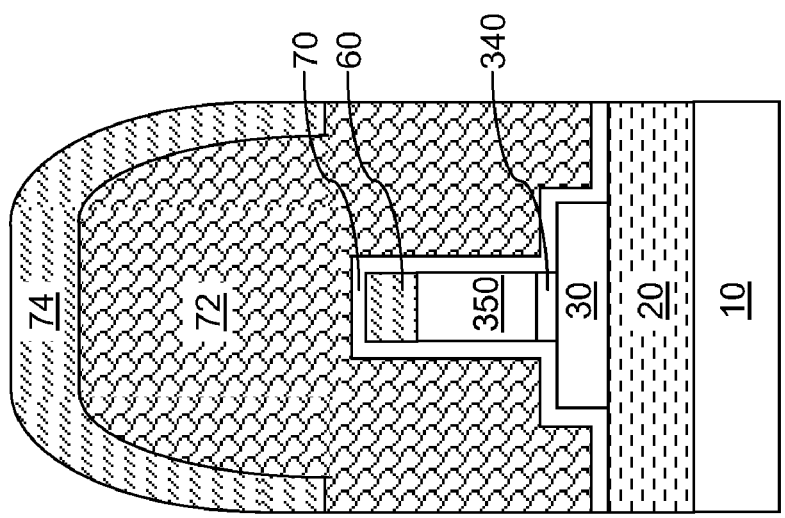
Figures 23A, 23B:
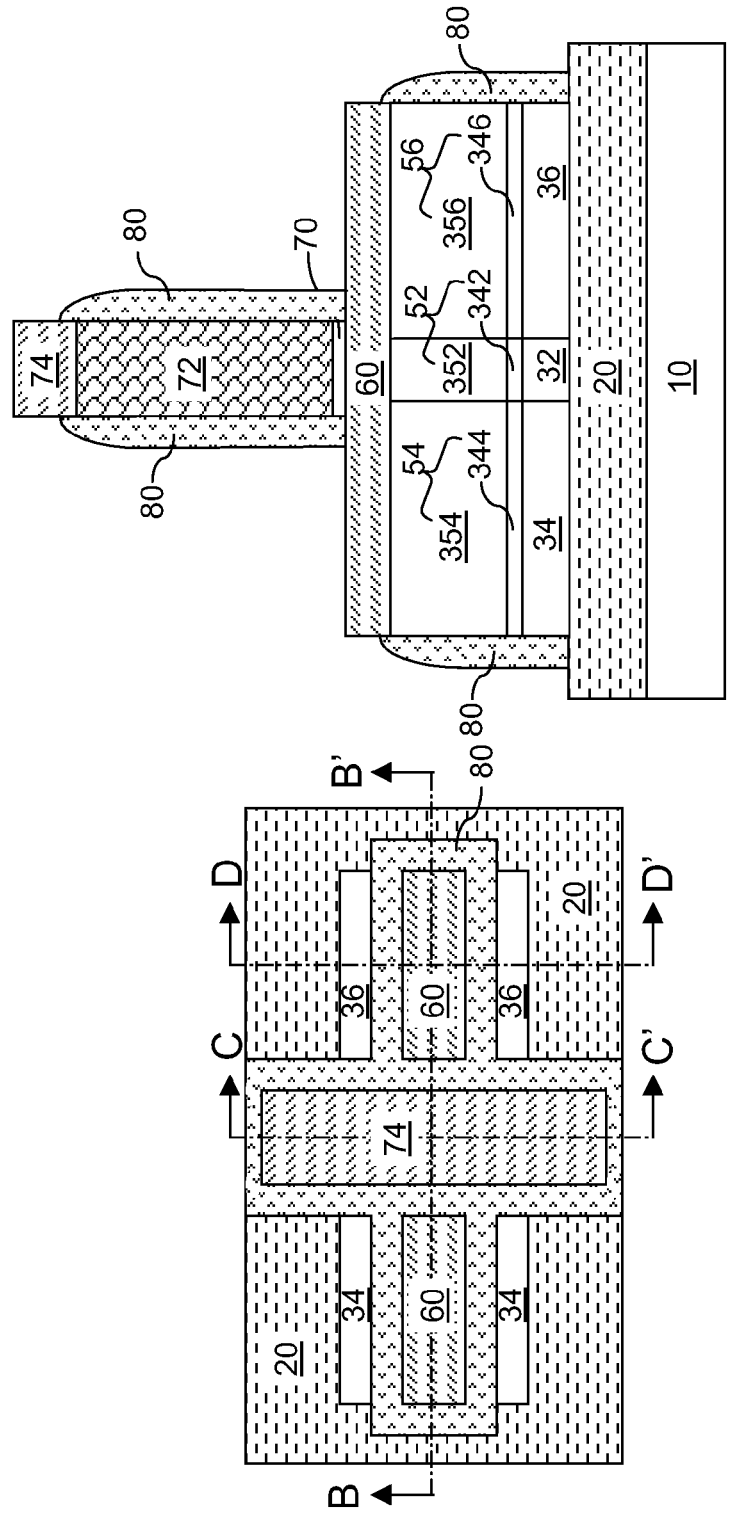
Figure 23D:
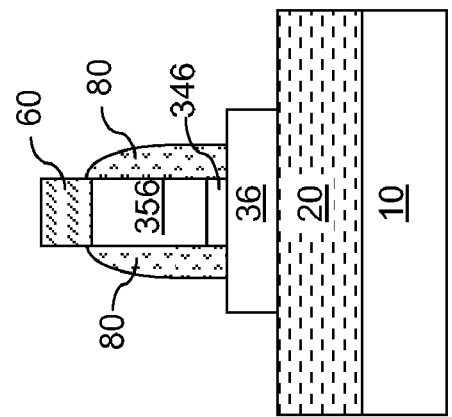
Figure 23C:
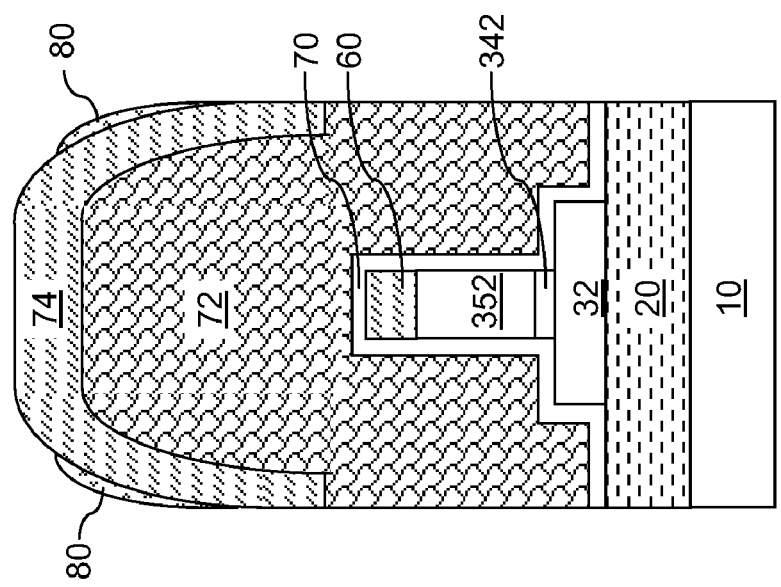
Figure 24B:
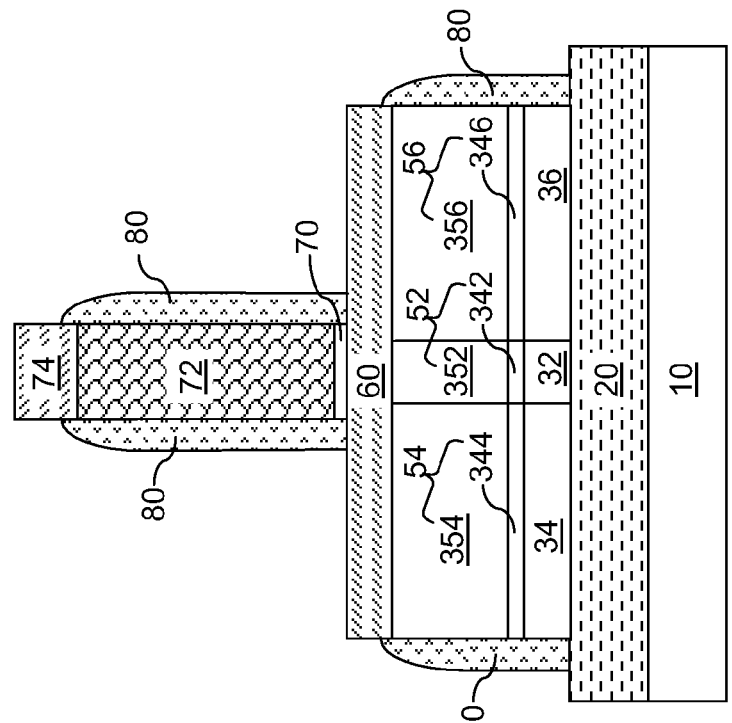
Figure 24A:
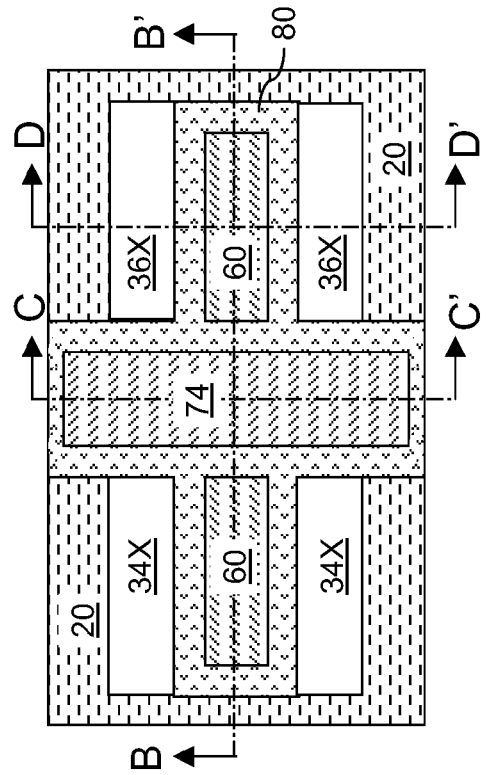
Figure 25B:
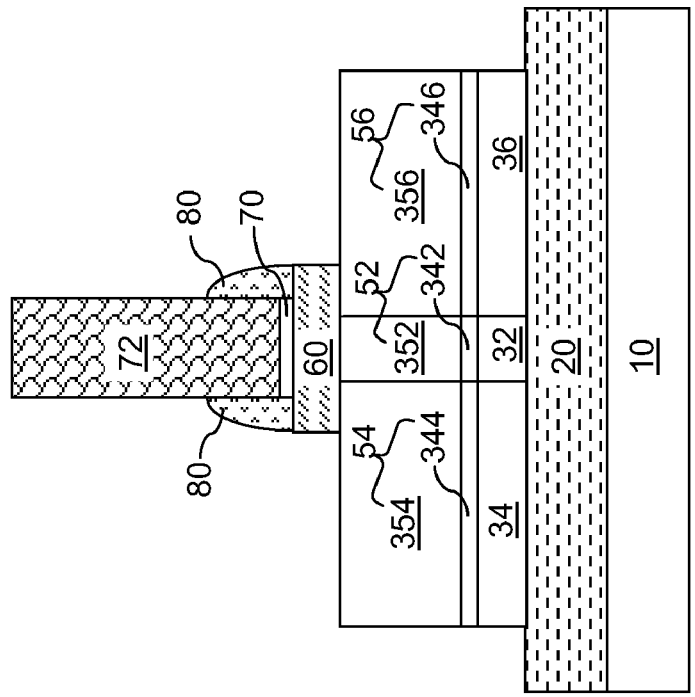
Figure 25A:
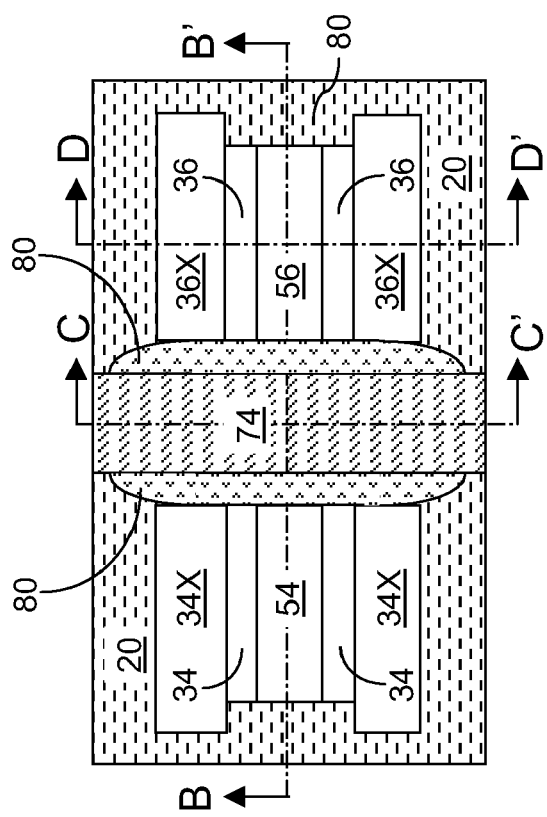
Figure 25D:
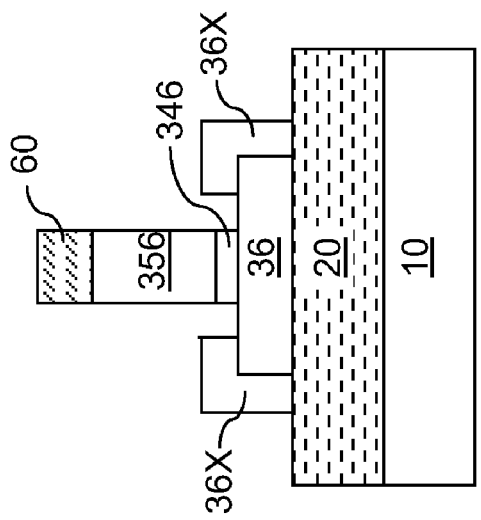
Figure 25C:
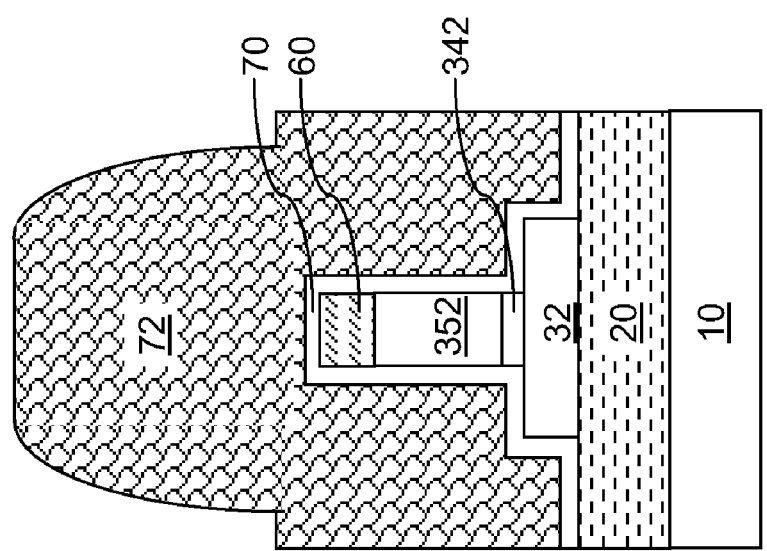
Figure 26B:
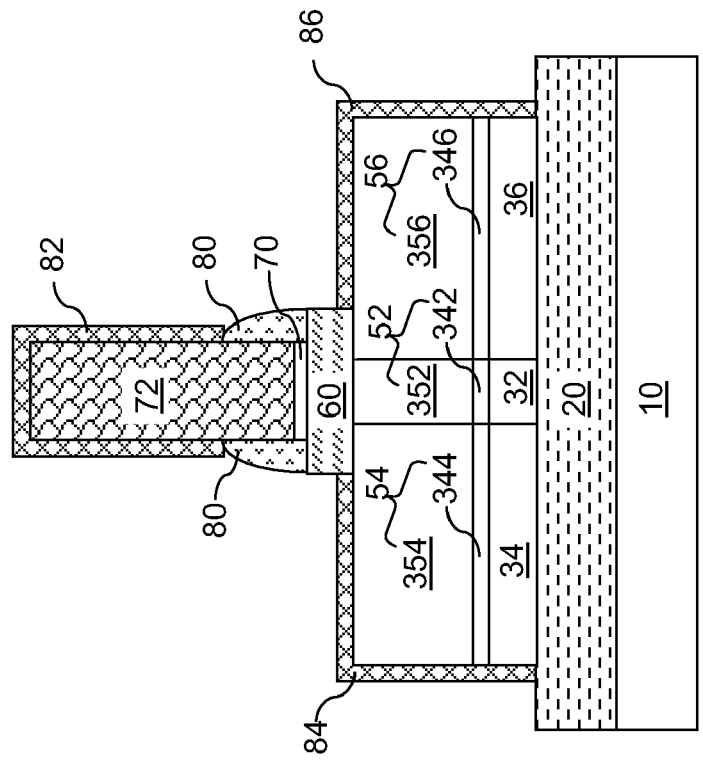
Figure 26A:
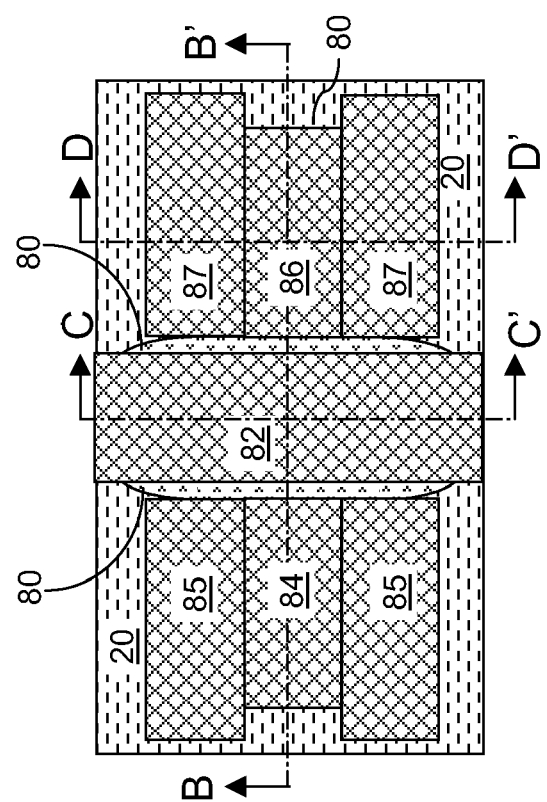
Figure 26C:
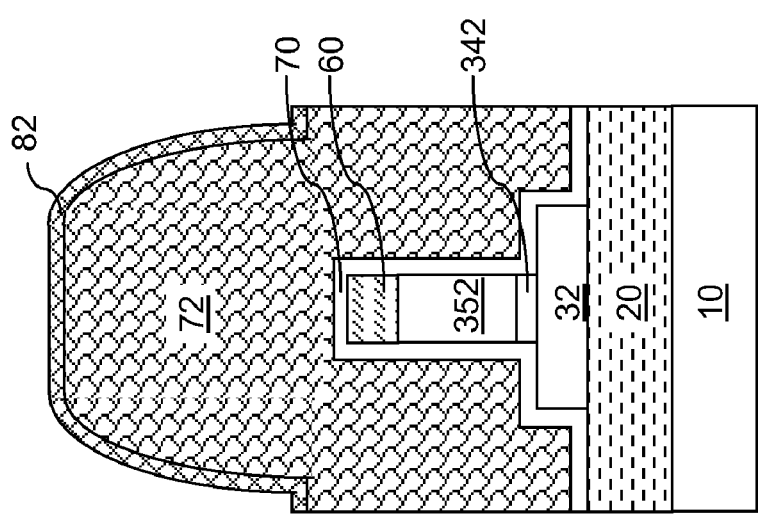
Figure 26D:
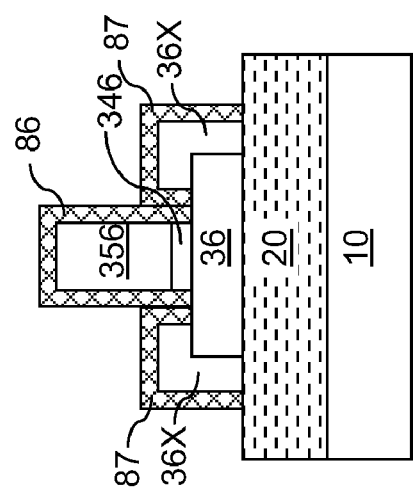

Referring to FIGS. 19A-19C, a second photoresist 69 is applied over the stack of the intermediate hardmask portion 60', the tapered upper semiconductor portion 350", the intermediate semiconductor etch stop portion 340', the tapered planar semiconductor portion 30', and the buried insulator layer 20 and lithographically patterned in the shape of a semiconductor fin to be subsequently formed. The shape of the semiconductor fin may be substantially rectangular. The pattern in the second photoresist 69 is transferred into the stack of the intermediate hardmask portion 60', the tapered upper semiconductor portion 350", and the intermediate semiconductor etch stop portion 340' by an anisotropic etch. Preferably, the anisotropic etch selective to the material of the intermediate semiconductor etch stop portion 340'.

The remaining portion of the intermediate hardmask portion 60' constitutes a hardmask portion 60. The remaining portion of the tapered upper semiconductor portion 350" constitutes a tapered semiconductor fin 350'. The second photoresist 69 is subsequently removed.

Referring to FIGS. 20A-20C, a crystallographic etch is employed to remove taper from the various tapered semiconductor portions including the tapered semiconductor fin 350' and the tapered planar semiconductor portion 30'. In general, a wet etch (e.g., an etch solution containing ammonia) or a reactive ion etch may be employed to create crystallographic facets that have different surface orientations than provided by the original surface orientation of the semiconductor substrate. An anisotropic etch process has different etch rates for different crystallographic orientations of the exposed surface and produces facets with the least etch rate for the given anisotropic etch process from the exposed silicon surface. By aligning the crystallographic orientations of vertical surfaces within the tapered semiconductor fin 350' and the tapered planar semiconductor portion 30' with crystallographic facets that the anisotropic etch produces, a top semiconductor fin portion 350 having vertical sidewalls is formed from a remaining portion of the tapered semiconductor fin 350'. A planar semiconductor portion 30 having vertical sidewalls is formed from a remaining portion of the tapered planar semiconductor portion 30'.

Referring to FIGS. 21A-21C, the exposed portions of the intermediate semiconductor etch stop portion 340' is subsequently removed selective to the material of the planar semiconductor portion 30 by an etch, which may be anisotropic or isotropic. Not necessarily but preferably, the etch is selective to the semiconductor material of the top semiconductor fin portion 350. The remaining portion of the intermediate semiconductor etch stop portion 340' constitutes a bottom semiconductor fin portion 340. The top semiconductor fin portion 350 and the bottom semiconductor fin portion 340 collectively constitute a semiconductor fin (350, 340).

The planar semiconductor portion 30 has a first width w1 and a first height h1, which have the same characteristics as in the first embodiment. The semiconductor fin (350, 340) has a second width w2 and a second height h2, which also have the same characteristics as in the first embodiment. Preferably, the planar semiconductor portion 30 and the semiconductor fin 50 have the same lengths L as in the first embodiment.

Referring to FIGS. 22A-22D, a gate cap portion 74, a gate electrode 72, and a gate dielectric 70 are formed over a middle portion of the semiconductor fin 50 and a middle portion of the planar semiconductor portion 30 by deposition and patterning of a gate dielectric layer, a gate electrode layer, and a gate cap dielectric layer in the same manner as in the first embodiment.

Referring to FIGS. 23A-23D, source regions and drain regions are formed employing the stack of the gate cap portion 74, the gate electrode 72, and the gate dielectric 70 as an implantation mask. Specifically, dopants of a second conductivity type, which is the opposite of the first conductivity type, are implanted into the semiconductor fin (350, 340) and the planar semiconductor portion 30 employing the stack of the gate cap portion 74, the gate electrode 72, and the gate dielectric 70 as the implantation mask to form a top fin source region 354 and a top fin drain region 356 in the top semiconductor fin portion 350, a bottom fin source region 344 and a bottom fin drain region 346 in the bottom semiconductor fin portion 340, and a planar source region 34 and a planar drain region 36 in the planar semiconductor portion 30. The top fin source region 354 and the bottom fin source region 344 collectively constitute a fin source region 54. The top fin drain region 356 and the bottom fin drain region 346 collectively constitute a fin drain region 56. The unimplanted portion of the top semiconductor fin portion 350 constitutes a top fin body region 352 having a doping of the first conductivity type. The unimplanted portion of the bottom semiconductor fin portion 340 constitutes a bottom fin body region 342 having a doping of the first conductivity type. The top fin body region 352 and the bottom fin body region 342 collectively constitute a fin body region 52. The unimplanated portion of the planar semiconductor portion 30 constitutes a planar body region 32 having a doping of the first conductivity type. Halo implantations may be performed into the semiconductor fin 50 and the planar semiconductor portion 30 to adjust threshold voltages of field effect transistors that comprises the semiconductor fin 50 and the planar semiconductor portion 30.

A dielectric spacer 80 is formed in the same manner as in the first embodiment. Additional dopants of the second conductivity type may be implanted into the fin source region 54, the fin drain region 56, the planar source region 34, and the planar drain region 36 to reduce resistivity of the implanted regions. Since ion implantation is performed employing the stack of the gate cap portion 74, the gate electrode 72, and the gate dielectric 70 and/or the dielectric spacer 80, the lateral extent of the fin body region 52 and the planar body region 32 is self-aligned with an offset to the edges of the gate electrode 72. Therefore, an edge of the fin source region 54 and an edge of the planar source region 34 are aligned to an edge of the gate electrode 72 with an offset. An edge of the fin drain region 56 and an edge of the planar drain region 36 are aligned to another edge of the gate electrode 72 with an offset.

Referring to FIGS. 24A-24D, a pair of epitaxial raised source portions 34X and a pair of epitaxial raised drain portions 36X are formed by selective epitaxy directly on exposed surfaces of the planar source region 34 and exposed surfaces of the planar drain region 36 in the same manner as in the first embodiment.

The crystal structure of the epitaxial raised source portions 34X is epitaxially aligned to the crystal structure of the planar source region 34. The crystal structure of the epitaxial raised drain portions 36X is epitaxially aligned to the crystal structure of the planar drain region 36. Preferably, the entirety of the planar semiconductor portion (32, 34, 36), the epitaxial raised source portions 34X, and the epitaxial raised drain portion 36X are epitaxially aligned. The planar semiconductor portion (32, 34, 36) may lack epitaxial alignment to any portion of the semiconductor fin (52, 54, 56) if the bonding is performed between the SOI layer 30L and a semiconductor etch stop layer 340L (See FIGS. 17A and 17B). The planar semiconductor portion (32, 34, 36) may be epitaxially aligned to the semiconductor etch stop layer 340L, but not aligned to the top semiconductor fin (352, 354, 256) if the bonding is performed between the semiconductor etch stop layer 340L and the upper semiconductor layer 350L (See FIGS. 17A and 17B). The planar semiconductor portion (32, 34, 36) may be epitaxially aligned to the semiconductor etch stop layer 340L and the top semiconductor fin (352, 354, 256) if epitaxy is employed to form the semiconductor etch stop layer 340L and the upper semiconductor layer 350L. Each of the epitaxial raised source portions 34X and the epitaxial raised drain portion 36X has an inverted-L shaped vertical cross-sectional area. The thickness of the epitaxial raised source portions 34X and the epitaxial raised drain portion 36X, as measured over a top surface of the planar source region 34 or the planar drain region 36 or on the sidewalls of the planar source region 34 or the planar drain region 36, may be from about 5 nm to about 100 nm, and typically from about 10 nm to about 50 nm, although lesser and greater thicknesses are explicitly contemplated herein.

Referring to FIGS. 25A-25D, the gate cap portion 74 and the hard mask portion 60 are recessed selective to the dielectric spacer 80 in the same manner as in the first embodiment.

Referring to FIGS. 26A-26D, various metal semiconductor alloy regions are formed by applying and reacting a metal layer with exposed semiconductor materials. Unreacted portions of the metal layer are subsequently removed. Specifically, a metal semiconductor alloy fin source portion 84 is formed directly on the fin source region 54 and a metal semiconductor alloy fin drain portion 86 is formed directly on the fin drain region 56. A pair of metal semiconductor alloy raised source portions 85 are formed directly on the pair of epitaxial raised source portions 34X, and a pair of metal semiconductor alloy raised drain portions 87 are formed directly on the pair of epitaxial raised drain portions 36X. The metal semiconductor alloy fin source portion 84 abuts each of the pair of metal semiconductor alloy raised source portions 85 with a seam. This seam adjoins the upper surface of the planar source region 34. The metal semiconductor alloy fin drain portion 86 abuts each of the pair of metal semiconductor alloy raised drain portions 87 with a seam. This seam adjoins the upper surface of the planar drain region 36.

The second exemplary semiconductor structure of FIGS. 26A-26D comprises a hybrid field effect transistor of the present invention. The hybrid field effect transistor of the second embodiment comprises a fin field effect transistor including the semiconductor fin (52, 54, 56) and a planar field effect transistor including the planar semiconductor portion (32, 34, 36) as the hybrid field effect transistor of the first embodiment. The fin field effect transistor vertically abuts the planar field effect transistor. The planar source region 34 and the fin source region 54 are electrically connected to each other, i.e., electrically shorted to each other. The planar drain region 36 and the fin drain region 56 are electrically connected to each other i.e., electrically shorted to each other. The planar body region 32 and the fin body region 52 are electrically connected to each other, i.e., electrically shorted to each other.

Figure 27A:
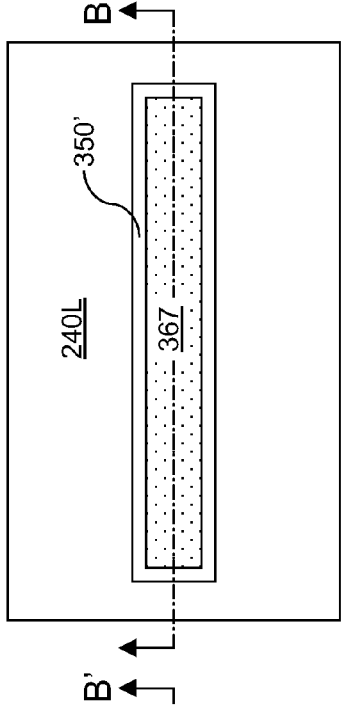
Figure 27B:
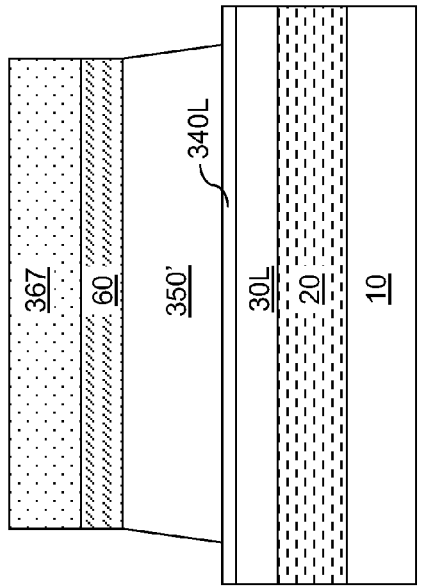

Referring to FIGS. 27A and 27B, a fourth exemplary semiconductor structure according to a fourth embodiment of the present invention comprises a semiconductor-on-insulator (SOI) substrate 8, a stack of a semiconductor etch stop layer 340L and an upper semiconductor layer 350L, and a hardmask layer 60L in the same manner as in the third embodiment of the present invention.

Figure 28A:
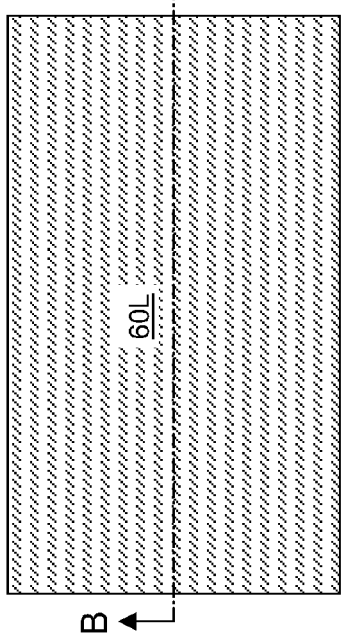
Figure 28B:
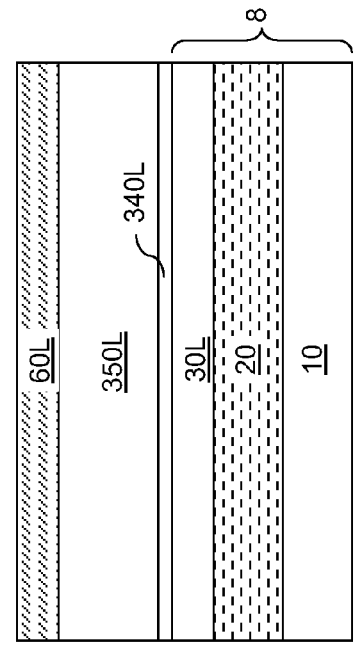

Referring to FIGS. 28A and 28B, a first photoresist 367 is applied over the hardmask layer 60L and lithographically patterned in the shape of a semiconductor fin to be subsequently formed. The shape of the semiconductor fin may be substantially rectangular. The pattern in the first photoresist 367 is transferred into the stack of the hardmask layer 60L and the upper semiconductor layer 350L by an anisotropic etch, which may be a reactive ion etch. The anisotropic etch is selective to the semiconductor etch stop layer 340L.

The remaining portion of the hardmask layer 60L comprises a hardmask portion 60'. The remaining portion of the upper semiconductor layer 350L constitutes a tapered semiconductor fin 350', which has sidewalls having a non-zero angle from the surface normal of the top surface of the SOI layer 30L.

Referring to FIGS. 29A-29C, a second photoresist 369 is applied over the stack of the hardmask portion 60, the tapered semiconductor fin 350', the semiconductor etch stop layer 340L, the upper semiconductor layer 350L, the SOI layer 30L, and the buried insulator layer 20, and lithographically patterned in the shape of a planar semiconductor portion to be subsequently formed. The shape of the planar semiconductor portion may be substantially rectangular. The pattern in the second photoresist 369 is transferred into the stack of the semiconductor etch stop layer 340L, the upper semiconductor layer 350L, and the SOI layer 30L by an anisotropic etch. Preferably, the anisotropic etch selective to the buried insulator layer 20.

The remaining portion of the semiconductor etch stop layer 340L constitutes an intermediate semiconductor etch stop portion 340'. The remaining portion of the SOI layer 30L constitutes a tapered planar semiconductor portion 30'. The second photoresist 369 is subsequently removed.

Referring to FIGS. 30A-30C, a crystallographic etch is employed to remove taper from the various tapered semiconductor portions including the tapered semiconductor fin 350' and the tapered planar semiconductor portion 30'. By aligning the crystallographic orientations of vertical surfaces within the tapered semiconductor fin 350' and the tapered planar semiconductor portion 30' with crystallographic facets that the anisotropic etch produces, a top semiconductor fin portion 350 having vertical sidewalls is formed from a remaining portion of the tapered semiconductor fin 350'. A planar semiconductor portion 30 having vertical sidewalls is formed from a remaining portion of the tapered planar semiconductor portion 30'.

Figure 31C:
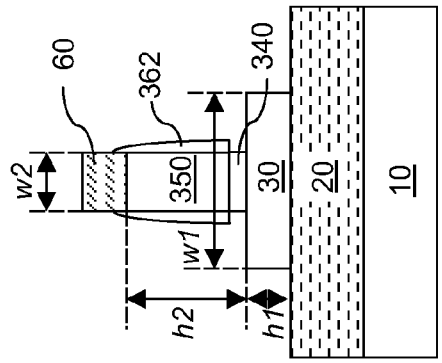
Figure 31A:
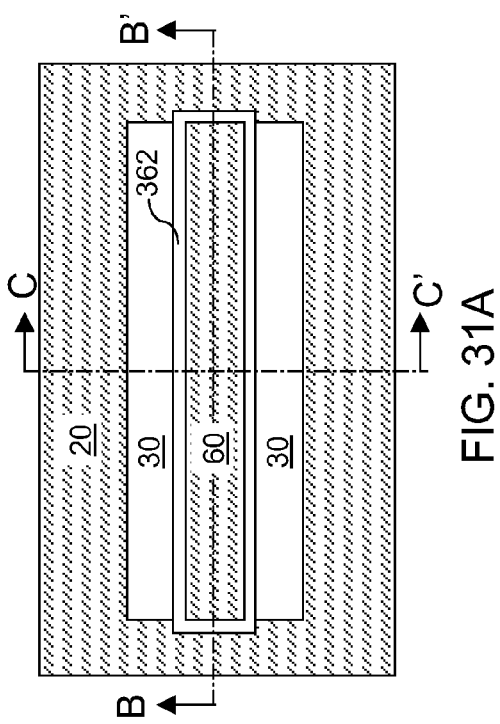
Figure 31B:
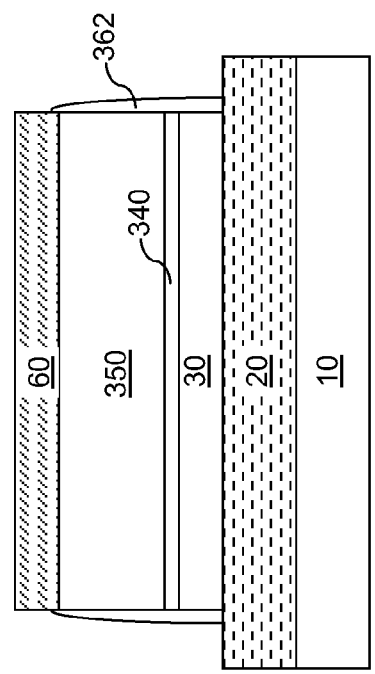

Referring to FIGS. 31A-31C, an optional etch block spacer 362 may be formed by a conformal deposition of a dielectric material layer followed by an anisotropic etch. The optional etch block spacer 362 is optional, i.e., may, or may not be employed. The optional etch block spacer 362 may be formed on the entirety of sidewalls of the top semiconductor fin portion 350, the entirety of the bottom semiconductor fin portion 340, and the end walls of the planar semiconductor portion 30. Portions of top surfaces of the planar semiconductor portion 30 and sidewalls of the planar semiconductor portion 30 in the lengthwise direction are exposed.

The exposed portions of the intermediate semiconductor etch stop portion 340' is subsequently removed selective to the material of the planar semiconductor portion 30 by an etch, which may be anisotropic or isotropic. Not necessarily but preferably, the etch is selective to the semiconductor material of the top semiconductor fin portion 350. The remaining portion of the intermediate semiconductor etch stop portion 340' constitutes a bottom semiconductor fin portion 340. The top semiconductor fin portion 350 and the bottom semiconductor fin portion 340 collectively constitute a semiconductor fin (350, 340).

The planar semiconductor portion 30 has a first width w1 and a first height h1, which have the same characteristics as in the first embodiment. The semiconductor fin (350, 340) has a second width w2 and a second height h2, which also have the same characteristics as in the first embodiment. Preferably, the planar semiconductor portion 30 and the semiconductor fin 50 have the same lengths L as in the first embodiment.

The fourth exemplary semiconductor structure becomes identical to the third exemplary semiconductor structure of FIGS. 21A-21C at this point. A gate cap portion 74, a gate electrode 72, and a gate dielectric 70 are formed as in the third embodiment. Thereafter, identical processing steps may be employed in the fourth embodiment as in the third embodiment to form the same structure as the third exemplary semiconductor structure of FIGS. 26A-26D.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a planar semiconductor portion having a first width and a first height and located above and abutting an insulator layer;
    a planar source region located in one side of said planar semiconductor portion;
    a planar drain region separated from and located on an opposite side of said planar source region in said planar semiconductor portion;
    a semiconductor fin having a second width and located above and abutting an upper surface of said planar semiconductor portion, wherein said planar semiconductor portion and a portion of said semiconductor fin comprise different semiconductor materials, and wherein said first width is greater than said second width;
    a gate dielectric abutting sidewalls of said vertical fin and horizontal upper surface of said planar semiconductor portion; and
    a gate electrode abutting said gate dielectric and overlying said planar semiconductor portion and said vertical fin.

2. The semiconductor structure of claim 1, wherein said planar semiconductor portion comprises a first semiconductor material and an entirety of said semiconductor fin comprises a second semiconductor material, wherein said first semiconductor material and said second semiconductor material are different.

3. The semiconductor structure of claim 1, wherein said planar semiconductor portion comprises a first semiconductor material and said semiconductor fin comprises a bottom semiconductor fin portion comprising a second semiconductor material and a top semiconductor fin portion comprising a third semiconductor material, wherein said first semiconductor material and said second semiconductor material are different.

4. The semiconductor structure of claim 1, further comprising:
    a fin source region located in one side of said semiconductor fin and abutting said planar source region and located in said semiconductor fin; and
    a fin drain region separated from and located on an opposite side of said fin source region and abutting said planar drain region and located in said semiconductor fin.

5. The semiconductor structure of claim 1, wherein said upper surface of said planar semiconductor portion has a first crystallographic orientation and a bottom surface of said semiconductor fin abutting said planar semiconductor portion has a second crystallographic orientation, wherein said first crystallographic orientation and said second crystallographic orientation are different.

6. A semiconductor structure comprising:
    a planar semiconductor portion having a first width and located above and abutting an insulator layer;
    a dielectric material portion having a second width and located above and abutting said planar semiconductor portion, wherein said first width is greater than said second width;
    a semiconductor fin having said second width and located above and abutting said dielectric material portion;
    a gate dielectric abutting sidewalls of said vertical fin and horizontal upper surface of said planar semiconductor portion; and
    a gate electrode abutting said gate dielectric and overlying said planar semiconductor portion and said vertical fin;
    a planar source region located in one side of said planar semiconductor portion; and
    a planar drain region separated from and located on an opposite side of said planar source region in said planar semiconductor portion.

7. The semiconductor structure of claim 6, wherein said planar semiconductor portion comprises a first semiconductor material and said semiconductor fin comprises a second semiconductor material, wherein said first semiconductor material and said second semiconductor material are different.

8. The semiconductor structure of claim 6, further comprising:
- a planar body region laterally abutting said planar source region and said planar drain region and located in said planar semiconductor portion;
- a fin source region located in one side of said semiconductor fin;
- a fin drain region separated from and located on an opposite side of said fin source region in said semiconductor fin; and
- a fin body region laterally abutting said fin source region and said fin drain region and located in said semiconductor fin, wherein edges of said planar body region and said fin source region are self-aligned to edges of said gate electrode with a constant offset, wherein said planar body region and said fin body region have a doping of a first conductivity type, wherein said planar source region, said planar drain region, said fin source region, and said fin drain region have a doping of a second conductivity type, and wherein said second conductivity type is the opposite of said first conductivity type.

9. The semiconductor structure of claim 6, further comprising:
- a pair of epitaxial raised source portions abutting said planar source region, wherein each of said pair of epitaxial raised source portions is epitaxially aligned to said planar source region, has a doping of said second conductivity type, has a vertical cross-sectional area of an inverted L-shape, and separated from each other and said semiconductor fin; and
- a pair of epitaxial raised drain portions abutting said planar drain region, wherein each of said pair of epitaxial raised drain portions is epitaxially aligned to said planar drain region, has a doping of said second conductivity type, has a vertical cross-sectional area of an inverted L-shape, and separated from each other and said semiconductor fin.

10. The semiconductor structure of claim 6, wherein said upper surface of said planar semiconductor portion has a first crystallographic orientation and a bottom surface of said semiconductor fin abutting said planar semiconductor portion has a second crystallographic orientation, wherein said first crystallographic orientation and said second crystallographic orientation are different.

11. A method of forming a semiconductor structure comprising:
- forming an upper semiconductor layer directly on a semiconductor-on-insulator (SOI) layer of a semiconductor-on-insulator (SOI) substrate, wherein said upper semiconductor layer and said SOI layer comprise different semiconductor materials;
- patterning said SOI layer, wherein a remaining portion of said SOI layer constitutes a planar semiconductor portion having a first width;
- patterning said upper semiconductor layer, wherein a remaining portion of said upper semiconductor layer constitutes a semiconductor fin having a second width, wherein said first width is greater than said second width;
- forming a gate dielectric on sidewalls of said semiconductor fin and on horizontal surfaces of said planar semiconductor portion;
- forming a gate electrode abutting said gate dielectric and overlying said planar semiconductor portion and said vertical fin;
- forming a planar source region in one side of said planar semiconductor portion; and
- forming a planar drain region on an opposite side of said planar source region in said planar semiconductor portion.

12. The method of claim 11, further comprising:
- etching said upper semiconductor layer selective to said SOI layer;
- forming a gate conductor layer over said gate dielectric;
- forming a gate cap dielectric layer on said gate conductor layer; and
- patterning said gate conductor and said gate cap dielectric layer, thereby forming a stack of said gate electrode and a gate cap over a middle portion of said semiconductor fin and over a middle portion of said planar semiconductor portion, wherein sidewalls of said gate electrode and said gate cap are vertically coincident.

13. The method of claim 11, further comprising:
- forming a fin source region in one side of said semiconductor fin and located in said semiconductor fin;
- forming a fin drain region on an opposite side of said fin source region in said semiconductor fin, wherein edges of said planar source region, said planar drain region, said fin source region, and said fin drain region are self-aligned to edges of said gate conductor with a constant offset.

14. The method of claim 13, further comprising:
- forming a pair of epitaxial raised source portions directly on said planar source region, wherein each of said pair of epitaxial raised source portions is epitaxially aligned to said planar source region, has a doping of said second conductivity type, has a vertical cross-sectional area of an inverted L-shape, and separated from each other and said semiconductor fin; and
- forming a pair of epitaxial raised drain portions directly on said planar drain region, wherein each of said pair of epitaxial raised drain portions is epitaxially aligned to said planar drain region, has a doping of said second conductivity type, has a vertical cross-sectional area of an inverted L-shape, and separated from each other and said semiconductor fin.

15. The method of claim 14, further comprising:
- forming a metal semiconductor alloy fin source portion directly on said fin source region;
- forming a pair of metal semiconductor alloy raised source portions directly on said pair of epitaxial raised source portions, wherein said metal semiconductor alloy fin source portion abuts each of said pair of metal semiconductor alloy raised source portions with a seam adjoining said planar source region;
- forming a metal semiconductor alloy fin drain portion directly on said fin drain region; and
- forming a pair of metal semiconductor alloy raised drain portions directly on said pair of epitaxial raised drain portions, wherein said metal semiconductor alloy fin drain portion abuts each of said pair of metal semiconductor alloy raised drain portions with a seam adjoining said planar drain region.

16. A method of forming a semiconductor structure comprising:
- forming a stack of an etch stop layer and an upper semiconductor layer directly on a semiconductor-on-insulator (SOI) layer of a semiconductor-on-insulator (SOI) substrate, wherein said etch stop layer and said upper semiconductor layer comprise different materials;
- patterning said SOI layer, wherein a remaining portion of said SOI layer constitutes a planar semiconductor portion having a first width;

patterning said upper semiconductor layer selective to said SOI layer, wherein a remaining portion of said upper semiconductor layer constitutes a semiconductor fin having a second width, wherein said first width is greater than said second width;

forming a gate dielectric on sidewalls of said semiconductor fin and on horizontal surfaces of said planar semiconductor portion;

forming a gate electrode abutting said gate dielectric and overlying said planar semiconductor portion and said vertical fin;

forming a planar source region in one side of said planar semiconductor portion; and forming a planar drain region on an opposite side of said planar source region in said planar semiconductor portion.

17. The method of claim 16, wherein said etch stop layer comprises a dielectric material or a semiconductor material in epitaxial alignment with said SOI layer and said upper semiconductor layer.

18. The method of claim 16, further comprising:

forming a fin source region in one side of said semiconductor fin and located in said semiconductor fin;

forming a fin drain region on an opposite side of said fin source region in said semiconductor fin, wherein edges of said planar source region, said planar drain region, said fin source region, and said fin drain region are self-aligned to edges of said gate conductor with a constant offset.

19. The method of claim 18, further comprising:

forming a pair of epitaxial raised source portions directly on said planar source region, wherein each of said pair of epitaxial raised source portions is epitaxially aligned to said planar source region, has a doping of said second conductivity type, has a vertical cross-sectional area of an inverted L-shape, and separated from each other and said semiconductor fin; and forming a pair of epitaxial raised drain portions directly on said planar drain region, wherein each of said pair of epitaxial raised drain portions is epitaxially aligned to said planar drain region, has a doping of said second conductivity type, has a vertical cross-sectional area of an inverted L-shape, and separated from each other and said semiconductor fin.

20. The method of claim 19, further comprising:

forming a metal semiconductor alloy fin source portion directly on said fin source region;

forming a pair of metal semiconductor alloy raised source portions directly on said pair of epitaxial raised source portions, wherein said metal semiconductor alloy fin source portion abuts each of said pair of metal semiconductor alloy raised source portions with a seam adjoining said planar source region;

forming a metal semiconductor alloy fin drain portion directly on said fin drain region; and forming a pair of metal semiconductor alloy raised drain portions directly on said pair of epitaxial raised drain portions, wherein said metal semiconductor alloy fin drain portion abuts each of said pair of metal semiconductor alloy raised drain portions with a seam adjoining said planar drain region.

* * * * *